(12) United States Patent  
Sel et al.

(10) Patent No.: US 8,198,157 B2  
(45) Date of Patent: Jun. 12, 2012

(54) METHODS OF FORMING NON-VOLATILE MEMORY DEVICES INCLUDING DUMMY WORD LINES

(75) Inventors: Jong-Sun Sel, Kyungki-Do (KR); Jung-Dal Choi, Kyungki-Do (KR); Young-Woo Park, Seoul (KR); Jin-Taek Park, Kyung-Ki Do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/236,913

(22) Filed: Sep. 20, 2011

(65) Prior Publication Data

US 2012/0045890 A1 Feb. 23, 2012

Related U.S. Application Data

(62) Division of application No. 11/729,169, filed on Mar. 28, 2007, now Pat. No. 8,045,383.

(30) Foreign Application Priority Data

Jul. 11, 2006 (KR) ........................ 10-2006-0065040

(51) Int. Cl.  
*H01L 21/82* (2006.01)  
*H01L 21/336* (2006.01)  
*H01L 21/4763* (2006.01)  
*H01L 21/44* (2006.01)

(52) U.S. Cl. ........ 438/257; 438/128; 438/129; 438/638; 438/666; 257/E21.385; 257/E21.419; 257/E21.613; 257/E21.69; 257/E21.691

(58) Field of Classification Search ........... 257/E21.385, 257/E21.419, E21.422, E21.69, E21.691, 257/E21.613  
See application file for complete search history.

(56) References Cited

U.S. PATENT DOCUMENTS

| | | | |
|---|---|---|---|
| 5,397,723 A | 3/1995 | Shirota et al. | |
| 5,729,491 A | 3/1998 | Kim et al. | |
| 6,239,008 B1 | 5/2001 | Yu et al. | |
| 6,495,435 B2 | 12/2002 | Templeton et al. | |
| 6,707,078 B1 | 3/2004 | Shiraiwa et al. | |
| 6,818,480 B2 | 11/2004 | Lee et al. | |
| 6,833,232 B2 | 12/2004 | Park | |
| 6,845,042 B2 | 1/2005 | Ichige et al. | |
| 7,079,437 B2 | 7/2006 | Hazama et al. | |
| 7,239,556 B2 | 7/2007 | Abe et al. | |
| 7,310,280 B2 | 12/2007 | Park et al. | |

(Continued)

FOREIGN PATENT DOCUMENTS

JP 04-212472 8/1992

(Continued)

*Primary Examiner* — Mohsen Ahmadi  
(74) *Attorney, Agent, or Firm* — Myers Bigel Sibley & Sajovec, P.A.

(57) ABSTRACT

A non-volatile memory device may include a semiconductor substrate including an active region at a surface thereof, a first memory cell string on the active region, and a second memory cell string on the active region. The first memory cell string may include a first plurality of word lines crossing the active region between a first ground select line and a first string select line, and about a same first spacing may be provided between adjacent ones of the first plurality of word lines. The second memory cell string may include a second plurality of word lines crossing the active region between a second ground select line and a second string select line, and about the same first spacing may be provided between adjacent ones of the second plurality of word lines. Related methods are also discussed.

14 Claims, 18 Drawing Sheets

U.S. PATENT DOCUMENTS

| | | |
|---|---|---|
| 7,440,322 B2 | 10/2008 | Kamei |
| 7,456,466 B2 * | 11/2008 | Om et al. ............. 257/315 |
| 7,480,178 B2 * | 1/2009 | Park et al. ............. 365/185.17 |
| 7,518,920 B2 * | 4/2009 | Kang ............. 365/185.17 |
| 7,575,992 B2 * | 8/2009 | Jung et al. ............. 438/597 |
| 7,821,809 B2 * | 10/2010 | Yoo et al. ............. 365/148 |
| 2004/0113199 A1 | 6/2004 | Hazama et al. |
| 2004/0174732 A1 | 9/2004 | Morimoto |
| 2005/0090085 A1 * | 4/2005 | Lindsay ............. 438/586 |
| 2006/0023558 A1 | 2/2006 | Cho et al. |
| 2006/0139997 A1 | 6/2006 | Park et al. |

FOREIGN PATENT DOCUMENTS

| | | |
|---|---|---|
| KR | 1019930008855 | 9/1993 |
| KR | 950014540 B | 12/1995 |
| KR | 1020040079328 | 9/2004 |
| KR | 1020050106280 | 11/2005 |
| KR | 1020060007177 | 1/2006 |

\* cited by examiner

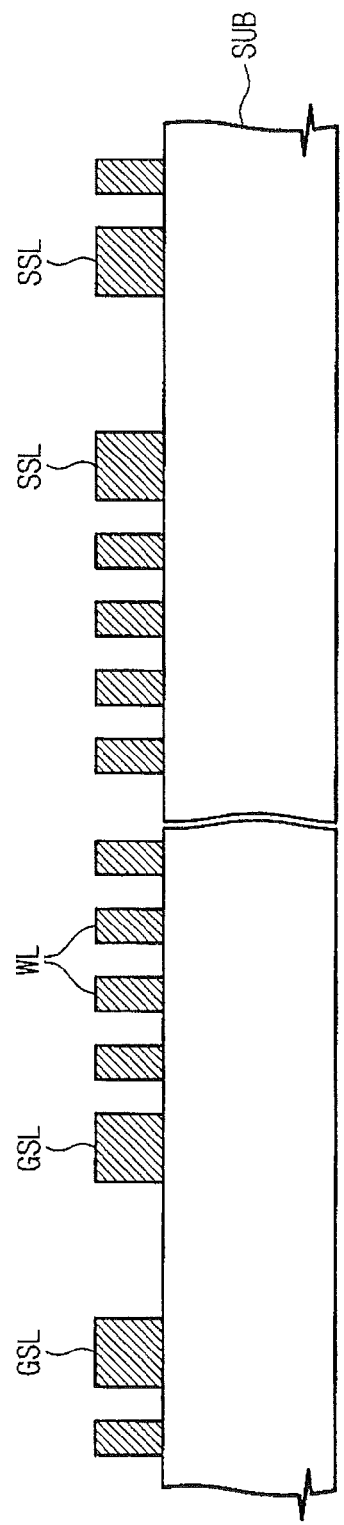

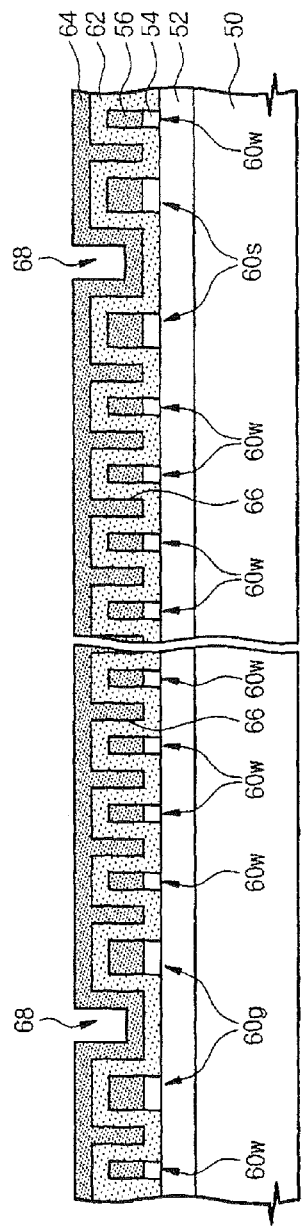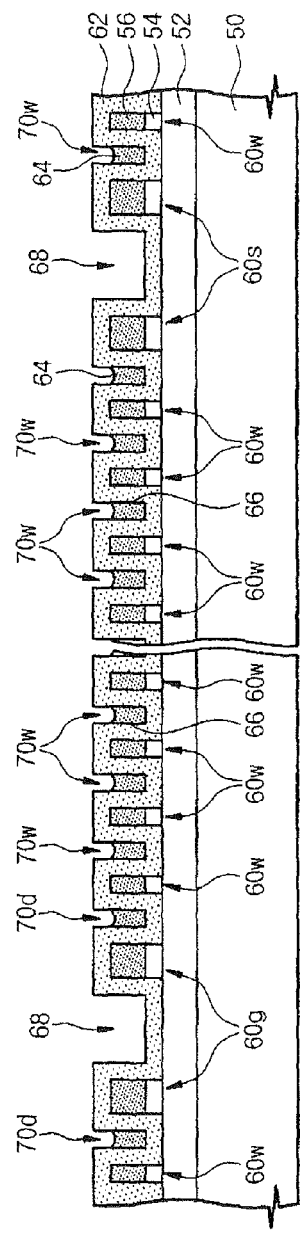

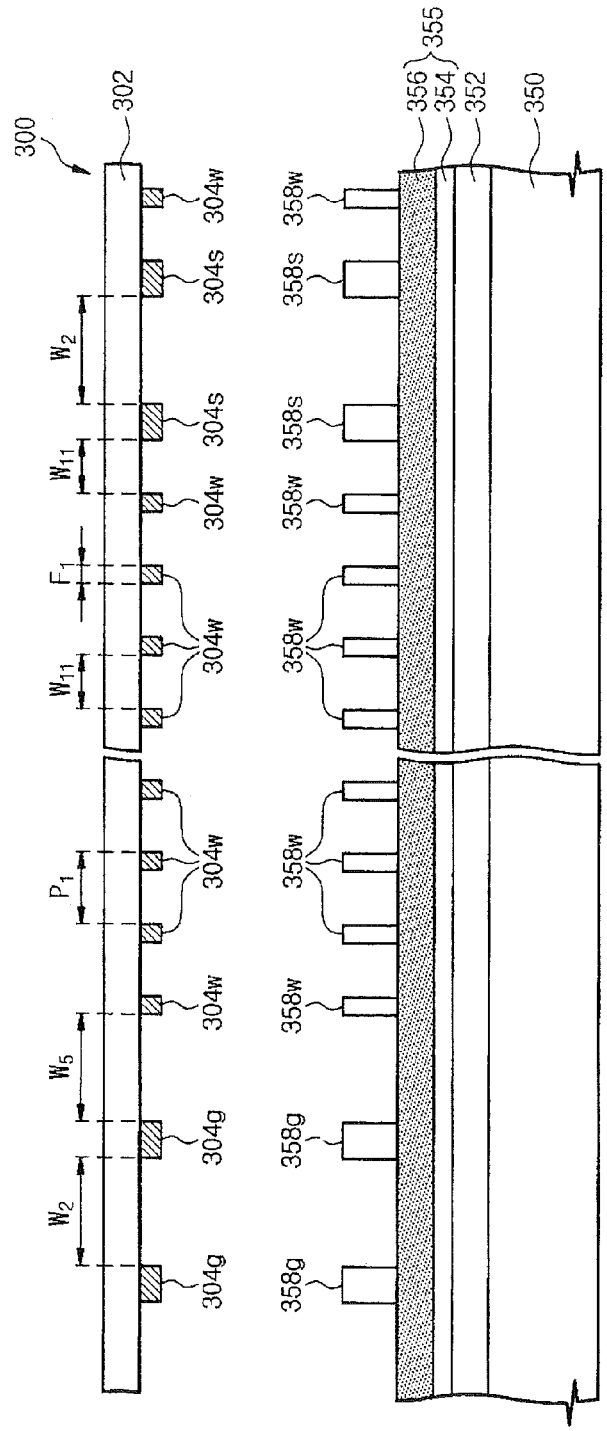

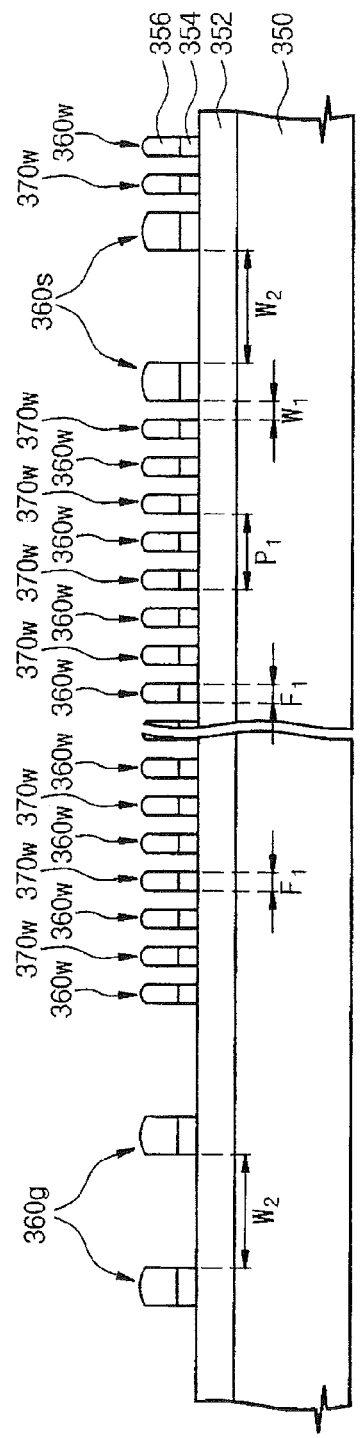

METHODS OF FORMING NON-VOLATILE MEMORY DEVICES INCLUDING DUMMY WORD LINES

RELATED APPLICATIONS

This U.S. non-provisional patent application claims the benefit of priority as a divisional of U.S. application Ser. No. 11/729,169 filed Mar. 28, 2007 now U.S. Pat. No. 8,045,383, which claims the benefit of priority under 35 U.S.C. §119 of Korean Patent Application No. 10-2006-0065040, filed on Jul. 11, 2006. The disclosures of both of the above referenced applications are hereby incorporated herein by reference in their entireties.

FIELD OF THE INVENTION

The present invention generally relates to electronics, and more particularly, to electronic memory devices and related methods.

BACKGROUND

Non-volatile memory devices, such as flash memory devices, may be provided in a NOR-type configuration or a NAND-type configuration. By way of example, NOR-type flash memory devices may provide relatively fast random access, while NAND-type flash memory devices may provide relatively low cost and/or relatively high integration. NOR-type flash memory devices may thus be used for code memory storage, while NAND-type flash memory devices may be used for mass memory storage.

NAND-type nonvolatile semiconductor memory devices are discussed, for example, in U.S. Pat. No. 7,079,437 to Hasama et al. entitled "Nonvolatile Semiconductor Memory Device Having Configuration Of NAND Strings With Dummy Memory Cells Adjacent To Select Transistors." More particularly, Hasama et al. discusses a nonvolatile semiconductor memory device having a plurality of electrically rewritable nonvolatile memory cells connected in series together. A select gate transistor is connected in series with the serial combination of memory cells, and the memory cell which is located adjacent to the select gate transistor is a dummy cell which is not used for data storage. During a data erase operation, a same bias voltage that that is applied to the other memory cells is also applied to the dummy cell.

Notwithstanding known nonvolatile memory devices, there continues to exist a need in the art for structures and methods providing more highly integrated memory devices.

SUMMARY

According to some embodiments of the present invention, a non-volatile memory device may include a semiconductor substrate including an active region at a surface thereof, and first and second memory cell strings on the active region. The first memory cell string may include a first plurality of word lines crossing the active region between a first ground select line and a first string select line, and about a same first spacing may be provided between adjacent ones of the first plurality of word lines. The second memory cell string may include a second plurality of word lines crossing the active region between a second ground select line and a second string select line, and about the same first spacing may be provided between adjacent ones of the second plurality of word lines. The first ground select line may be between the second ground select line and the first plurality of word lines, and the second ground select line may be between the first ground select line and the second plurality of word lines. Portions of the active region between the first and second ground select lines may be free of word lines, and a second spacing between the first and second ground select lines may be at least about 3 times greater than the first spacing.

The second spacing may be in the range of about 3 to 4 times greater than the first spacing. The second spacing may be more than 3 times greater than the first spacing, and more particularly, the second spacing may be at least about 4 times greater than the first spacing.

The first plurality of word lines may include an even number of memory cell word lines and a dummy word line between a first of the even number of memory cell word lines and the first ground select line. About the same first spacing may be provided between the ground select line and the dummy word line, and about the same first spacing may be provided between the dummy word line and the first of the even number of memory cell word lines. Moreover, about the same first spacing may be provided between a last of the even number of the memory cell word lines and the string select line.

The first plurality of word lines may include an even number of memory cell word lines and a dummy word line between a first of the even number of memory cell word lines and the first ground select line. About the same first spacing may be provided between the dummy word line and the first of the even number of memory cell word lines, and a third spacing may be provided between the ground select line and the dummy word line. Moreover, the third spacing may be greater than the first spacing and no greater than two times the first spacing, and more particularly, the third spacing may be in the range of about 1.5 times the first spacing to about 2 times the first spacing.

The first plurality of word lines may include an even number of memory cell word lines, and at least 3 times the first spacing may be provided between the ground select line and the first of the even number of memory cell word lines. About the first spacing may be provided between the last of the even number of memory cell word lines and the string select line, and portions of the active region between the ground select line and the first of the even number of memory cell word lines may be free of word lines.

Each memory cell of the first and second memory cell strings may include a charge storage layer between the respective word line and the active region, and a barrier insulating layer between the charge storage layer and the word line. Moreover, an arrangement of the first memory cell string may have mirror image symmetry relative to an arrangement of the second memory cell string.

According to other embodiments of the present invention, a non-volatile memory device may include a semiconductor substrate including an active region at a surface thereof, a ground select line crossing the active region, and a string select line crossing the active region and spaced apart from the ground select line. A plurality of memory cell word lines may cross the active region between the ground select line and the string select line, and about a same first spacing may be provided between adjacent ones of the plurality of word lines. A second spacing may be provided between a last of the plurality of memory cell word lines and the string select line, and the second spacing may be greater than the first spacing and no greater than two times the first spacing. A dummy word line may be between a first of the plurality of memory cell word lines and the first ground select line, and about the first spacing may be provided between the dummy word line and the first of the plurality of memory cell word lines. A third spacing may be provided between the ground select line and the dummy word line, and the third spacing may be greater than the first spacing and no greater than two times the first spacing. More particularly, the third spacing may be in the range of about 1.5 times the first spacing to about 2 times the first spacing.

The plurality of memory cell word lines may be a first plurality of memory cell word lines, and the non-volatile memory device may further include a second ground select line crossing the active region, a second string select line crossing the active region, and a second plurality of memory cell word lines. The first ground select line may be between the second ground select line and the first plurality of memory cell word lines, and the second string select line may be spaced apart from the second ground select line with the second ground select line between the second string select line and the first ground select line. The second plurality of memory cell word lines may be between the second ground select line and the second string select line. Moreover, portions of the active region between the first and second ground select lines may be free of word lines, and a second spacing between the first and second ground select lines may be at least about 3 times greater than the first spacing.

The second spacing may be in the range of about 3 to about 4 times greater than the first spacing. More particularly, the second spacing may be more than 3 times greater than the first spacing, and still more particularly, the second spacing may be at least about 4 times greater than the first spacing.

In addition, a plurality of charge storage layers may be provided with respective ones of the charge storage layers between each of the plurality of word lines and the active region, and a plurality of barrier insulating layers may be provided with respective ones of the barrier insulating layers between each of the plurality of word lines and the charge storage layers. Moreover, the plurality of memory cell word lines may include an even number of memory cell word lines.

According to some other embodiments of the present invention, a non-volatile memory device may include a semiconductor substrate including a active region at a surface thereof, a ground select line crossing the active region, a string select line crossing the active region, and a plurality of memory cell word lines crossing the active region. The string select line may be spaced apart from the ground select line, and the plurality of memory cell word lines may cross the active region between the ground select line and the string select line. About a same first spacing may be provided between adjacent ones of the plurality of word lines and between a last of the plurality of memory cell word lines and the string select line. A second spacing may be provided between the ground select line and a first of the plurality of memory cell word lines, and the second spacing may be at least three times greater than the first spacing. Moreover, portions of the active region between the ground select line and the first of the plurality of memory cell word lines may be free of word lines. More particularly, the second spacing may be about three times greater than the first spacing, and/or the second spacing may be no greater than 4 times the first spacing.

The plurality of memory cell word lines may be a first plurality of memory cell word lines, and the non-volatile memory device further include a second ground select line crossing the active region, a second string select line crossing the active region, and a second plurality of memory cell word lines crossing the active region. The first ground select line may be between the second ground select line and the first plurality of memory cell word lines, and the second string select line may be spaced apart from the second ground select line with the second ground select line between the second string select line and the first ground select line. The second plurality of memory cell word lines may be between the second ground select line and the second string select line. Moreover, portions of the active region between the first and second ground select lines may be free of word lines, and a second spacing between the first and second ground select lines may be at least about 3 times greater than the first spacing.

The second spacing may be in the range of about 3 to about 4 times greater than the first spacing, and more particularly, the second spacing may be about 3 times greater than the first spacing or at least about 4 times greater than the first spacing.

In addition, a plurality of charge storage layers may be provided with respective ones of the charge storage layers between each of the plurality of word lines and the active region, and a plurality of barrier insulating layers may be provided with respective ones of the barrier insulating layers between each of the plurality of word lines and the charge storage layers. Moreover, the plurality of memory cell word lines may include an even number of memory cell word lines.

According to still other embodiments of the present invention, a method of forming a non-volatile memory device may include forming an etch target layer on a substrate. First hard mask patterns may be formed including a plurality of odd word line patterns between first and second select line patterns, and about a same spacing may be provided between the first select line pattern and a first odd word line pattern, between adjacent odd word line patterns, and between a last odd word line pattern and the second select line pattern. Moreover, the first hard mask pattern may include a first material. A sacrificial mask layer may be formed on the first hard mask pattern with gaps remaining between portions of the sacrificial mask layer on sidewalls of adjacent ones of the odd word line patterns. The sacrificial mask layer may include a second material, and the first and second materials may have different compositions. Second hard mask patterns may be formed on the sacrificial mask layer, and the second hard mask patterns may include a dummy word line pattern between the first select line pattern and the first odd word line pattern. The second hard mask patterns may also include even word line patterns between adjacent odd word line patterns and between the last odd word line pattern and the second select line pattern. Moreover, the second hard mask pattern may include a third material, and the second and third materials may have different compositions. Portions of the sacrificial mask layer between the first and second hard mask patterns may be removed so that portions of the etch target layer are exposed between the first and second hard mask patterns, and portions of the etch target layer exposed between the first and second hard mask patterns may be etched.

The spacing provided between the first select line pattern and the first odd word line pattern may be about three times a width of the first odd word line pattern. Moreover, the first hard mask patterns may include silicon nitride, the sacrificial mask layer may include polysilicon, and the second hard mask patterns may include silicon oxide.

The odd word line patterns may have about a same width, and the spacing between adjacent ones of the plurality of the odd word line patterns may be greater than the width of the odd word line patterns. In addition, forming the etch target layer may include forming a charge storage layer on the substrate, forming a barrier insulating layer on the charge storage layer, and forming a control gate layer on the barrier insulating layer.

According to yet other embodiments of the present invention, a method of forming a non-volatile memory device may include forming an etch target layer on a substrate. First hard mask patterns may be formed on the substrate, and the first hard mask patterns may include a plurality of even word line patterns between first and second select line patterns and a dummy word line pattern between the first select line pattern and a first even word line pattern. About a same first spacing may be provided between the dummy word line pattern and the first even word line pattern and between adjacent even word line patterns, and a second spacing may be provided between the first select line pattern and the dummy word line pattern and between a last even word line pattern and the second select line pattern. Moreover, the second spacing may be less than the first spacing, and the first hard mask patterns may include a first material. A sacrificial mask layer may be formed on the first hard mask patterns with gaps remaining between portions of the sacrificial mask layer on sidewalls of adjacent ones of the even word line patterns and between the dummy word line pattern and the first even word line pattern. The sacrificial mask layer may include a second material, and the first and second materials may have different compositions. Second hard mask patterns may be formed in the gaps on the sacrificial layer, and the second hard mask patterns may include odd word line patterns between adjacent even word line patterns and between the dummy word line pattern and the first even word line pattern. The second hard mask patterns may include a third material, and the second and third materials may have different compositions. Portions of the sacrificial mask layer may be removed between the first and second hard mask patterns so that portions of the etch target layer are exposed between the first and second hard mask patterns, and a space between the dummy word line pattern and the first select line pattern may be free of any of the second hard mask patterns. Portions of the etch target layer exposed between the first and second hard mask patterns may then be etched.

The first spacing provided between the dummy word line pattern and a first even word line pattern and between adjacent even word line patterns may be about three times a width of the first even word line pattern. The second spacing may be greater than a width of the first even word line pattern and no greater than two times the width of the first even word line pattern. The second spacing may be in the range of about 1.5 times the width of the first even word line pattern to about 2 times the width of the first even word line pattern.

The even word line patterns may have about a same width, and the spacing between adjacent ones of the plurality of the even word line patterns may be greater than the width of the even word line patterns. In addition, forming the etch target layer may include forming a charge storage layer on the substrate, forming a barrier insulating layer on the charge storage layer, and forming a control gate layer on the barrier insulating layer.

A method of forming a non-volatile memory device may include forming an etch target layer on a substrate and forming first hard mask patterns on the substrate. The first hard mask patterns may include a plurality of odd word line patterns between first and second select line patterns, and about a same first spacing may be provided between adjacent odd word line patterns and between a last odd word line pattern and the second select line pattern. A second spacing may be provided between the first select line pattern and a first odd word line pattern, and the second spacing may be greater than the first spacing, and the first hard mask patterns may include a first material. A sacrificial mask layer may be formed on the first hard mask patterns with gaps remaining between portions of the sacrificial mask layer on sidewalls of adjacent first hard mask patterns, and the sacrificial mask layer may include a second material, the first and second materials having different compositions. Second hard mask patterns may be formed on the sacrificial layer, and the second hard mask patterns may include even word line patterns between adjacent odd word line patterns and between the last odd word line pattern and the second select line pattern. A space between the first select line pattern and the first odd word line pattern may be free of any of the second hard mask patterns, and the second hard mask patterns may include a third material with the second and third materials having different compositions. Portions of the sacrificial mask layer may be removed between the first and second hard mask patterns so that portions of the etch target layer are exposed between the first and second hard mask patterns. Portions of the etch target layer exposed between the first and second hard mask patterns may then be etched.

The same first spacing may be about three times a width of the first odd word line pattern. In addition, forming the etch target layer may include forming a charge storage layer on the substrate, forming a barrier insulating layer on the charge storage layer, and forming a control gate layer on the barrier insulating layer.

BRIEF DESCRIPTION OF THE DRAWINGS

FIG. 1B is a cross-sectional view taken along line I-I' of FIG. 1A.

FIGS. 5A-D are cross-sectional views illustrating operations of forming non-volatile memory structures of FIGS. 2A-B according to embodiments of the present invention.

FIGS. 7A-D are cross-sectional views illustrating operations of forming non-volatile memory structures of FIGS. 4A-B according to embodiments of the present invention.

DETAILED DESCRIPTION

Figure 1A:
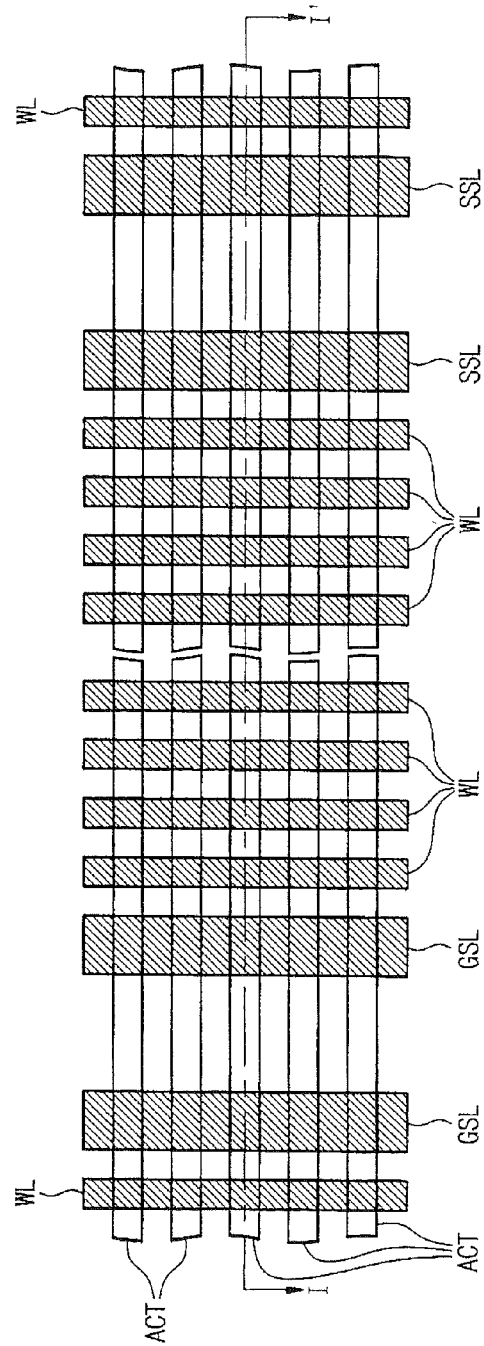
FIG. 1A is a plan view of a non-volatile memory device according to some embodiments of the present invention.

The present invention is described more fully hereinafter with reference to the accompanying drawings, in which embodiments of the present invention are shown. This invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein. All publications, patent applications, patents, and other references mentioned herein are incorporated by reference in their entirety.

As shown in FIGS. 1A and 1B, a flash memory device may include a plurality of parallel active regions ACT in a semiconductor substrate separated by device isolation layers. In addition, ground select lines GSL, string select lines SSL, and word lines WL may cross the active regions ACT. More particularly, a respective charge storage gate may be provided between each word line WL and each active region ACT to provide a respective memory cell at each intersection of a word line WL and an active region ACT. Moreover, a plurality of memory cells along an active region ACT between a ground select line GSL and a string select line SSL may define a memory cell string. As further shown in FIGS. 1A and 1B, adjacent memory cell strings may be separated by two ground select lines GSL or by two string select lines SSL.

Figure 1C:
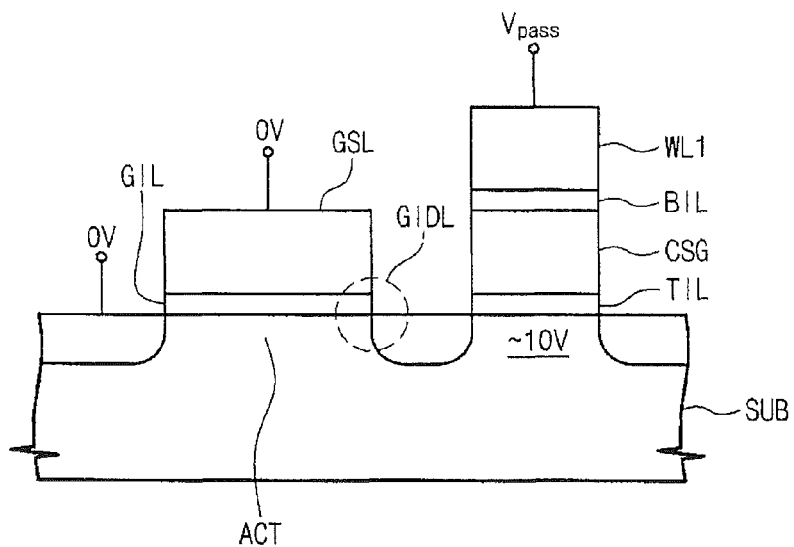
FIG. 1C is an enlarged cross-sectional view illustrating ground induced leakage current during a programming operation.
Figure 1D:
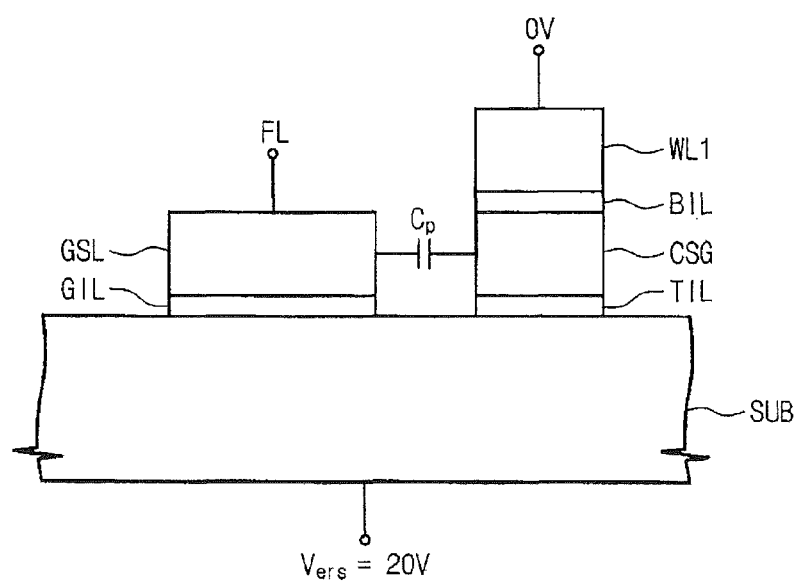
FIG. 1D is an enlarged cross-sectional view illustrating coupling capacitance during an erase operation.

As shown in the enlarged cross-sectional views of FIGS. 1C and 1D, a gate insulating layer GIL may be provided between the ground select line GSL and the active region ACT of the semiconductor substrate SUB. In addition, a charge storage gate CSG may be provided between the word line WL1 and the active region ACT of the substrate SUB, a tunnel insulating layer TIL may be provided between the charge storage gate CSG and the active region ACT, and a barrier insulating layer BIL may be provided between the charge storage gate CSG and the word line WL1.

During a programming operation (for a memory cell other than that shown in FIG. 1C), 0 volts may be applied to the ground select line GSL and a pass voltage Vpass may be applied to the non-selected word line WL1 as shown in FIG. 1C. In addition, a program voltage Vpgm may be applied to a selected word line (not shown) corresponding to a memory cell(s) to be programmed. A gate voltage of the ground select transistor (defined by the ground select line GSL and the gate insulating layer GIL) may thus be 0 volts while a drain voltage of the ground select transistor may be about 10 volts resulting in a gate induced leakage current GIDL.

During an erase operation, the ground select line GSL may be allowed to float, and an erase voltage Vers of about 20 volts may be applied to a p-well of the substrate SUB, and 0 volt may be applied to the word line WL1, as shown in FIG. 1D. Accordingly, the erase voltage Vers of 20 volts applied to the p-well may boost a potential of the ground select line GSL, and a potential of the charge storage gate CSG (adjacent to the ground select line GSL) may increase due to capacitive coupling Cp between the ground select line GSL and the charge storage gate CSG. An undesirable erase disturbance may thus result at the charge storage gate CSG and/or the word line WL1.

Figure 2A:
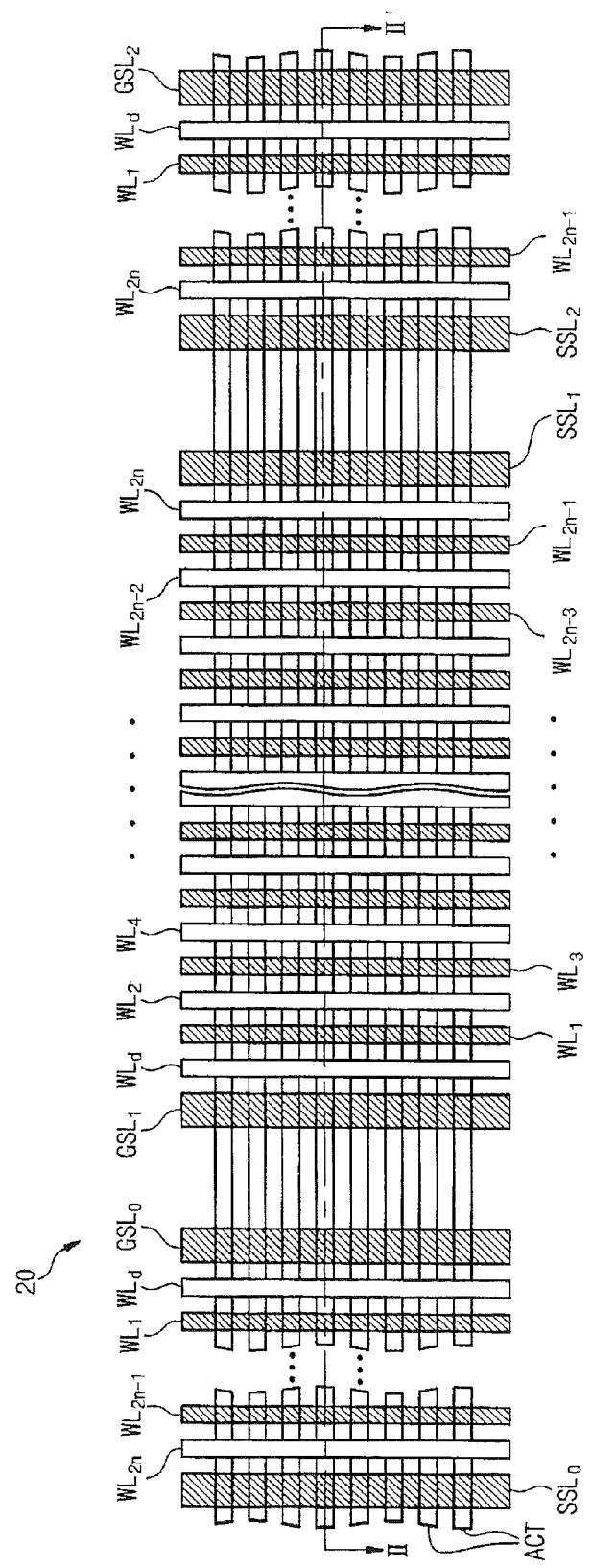
FIG. 2A is a plan view of a non-volatile memory device according to some embodiments of the present invention.
Figure 2B:
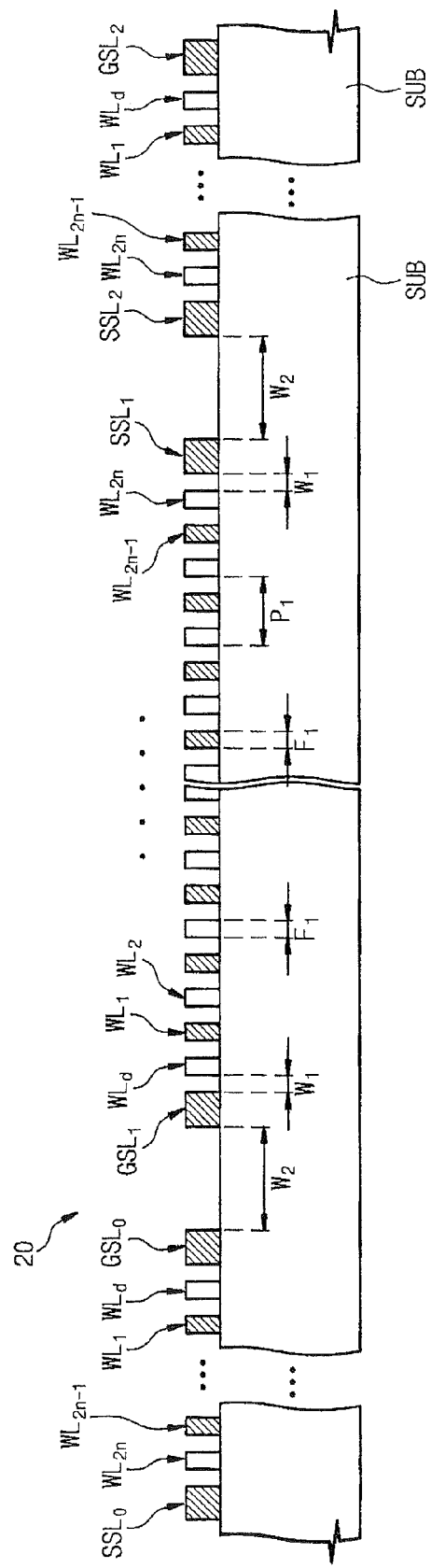
FIG. 2B is a cross-sectional view taken along section line II-II' of FIG. 2A.

FIG. 2A is a plan view of a non-volatile memory device 20 (such as a flash memory device) according to some embodiments of the present invention, and FIG. 2B is a cross-sectional view taken along section line II-II' of FIG. 2A. The flash memory device 20 may include a plurality of parallel active regions ACT in a semiconductor substrate SUB separated by device isolation layers. In addition, ground select lines $GSL_{0-2}$, string select lines $SSL_{0-2}$, dummy word lines $WL_d$, and memory cell word lines $WL_{1-2n}$ (where n is an integer) may cross the active regions ACT. More particularly, a respective charge storage gate may be provided between each memory cell word line $WL_{1-2n}$ and each active region ACT to provide a respective memory cell at each intersection of a memory cell word line $WL_{1-2n}$ and an active region ACT. Similarly, a charge storage gate may be provided between each dummy word line $WL_d$ and active region ACT so that the structures of the dummy word lines $WL_d$ and the memory cell word lines $WL_{1-2n}$ are the same.

An even number of memory cell word lines $WL_{1-2n}$ along an active region ACT between a ground select line GSL and a string select line SSL (e.g., between $GSL_1$ and $SSL_1$) may define a memory cell string including an even number of memory cells. As further shown in FIGS. 2A-B, adjacent memory cell strings may be separated by two ground select lines GSL (e.g., $GSL_0$ and $GSL_1$) or by two string select lines SSL (e.g., $SSL_1$ and $SSL_2$). More particularly, $2^k$ (where k is a positive integer) memory cell word lines $WL_{1-2n}$ may define a memory cell string including $2^k$ memory cells used to store data. The dummy word line $WL_d$, however, is not used to store data.

Moreover, an order of memory cell word lines $WL_{1-2n}$ and dummy word line $WL_d$ of adjacent memory cell strings may have a mirror image symmetry. For example, an order of memory cell word lines $WL_{1-2n}$ and dummy word line $WL_d$ between ground select line $GSL_0$ and string select line $SSL_0$ may have mirror image symmetry relative to an order of memory cell word lines $WL_{1-2n}$ and dummy word line $WL_d$ between ground select line $GSL_1$ and string select line $SSL_1$. Similarly, an order of memory cell word lines $WL_{1-2n}$ and dummy word line $WL_d$ between ground select line $GSL_1$ and string select line $SSL_1$ may have mirror image symmetry relative to an order of memory cell word lines $WL_{1-2n}$ and dummy word line $WL_d$ between ground select line $GSL_2$ and string select line $SSL_2$.

By providing a dummy word line $WL_d$ between a ground select line GSL and a first memory cell word line $WL_1$ of a memory cell string, a ground induced leakage current and/or an erase disturbance at the first memory cell word line $WL_1$ may be reduced. Moreover, a controller of the non-volatile memory device may be coupled to the ground select lines, the string select lines, the memory cell word lines, and the dummy word lines. During an erase operation, for example, the controller may be configured to allow the ground select line $GSL_1$ to float, to apply an erase voltage Vers of about 20 volts to a p-well of the substrate SUB, and to apply 0 volts to the memory cell word lines $WL_{1-2n}$. In addition, the controller may be configured to apply a bias voltage Vb to the dummy word line $WL_d$ with the bias voltage Vb being between a supply voltage Vcc and a pass voltage Vpass (i.e., Vcc<Vb<Vpass) to thereby reduce an erase disturbance at the first memory cell word line $WL_1$ and/or at respective charge storage layers.

During a write (or program) operation, the controller may be configured to apply the supply voltage Vcc to the ground select line $GSL_1$, to apply 0 volts to a p-well of the substrate SUB, to apply a pass voltage Vpass to the non-selected word lines, and to apply a program voltage Vpgm to the selected word line. In addition, the controller may be configured to apply a bias voltage Vb to the dummy word line $WL_d$ with the bias voltage Vb being between the supply voltage Vcc and the pass voltage Vpass (i.e., Vcc<Vb<Vpass) to thereby reduce ground induced leakage current at the ground select line adjacent to the dummy word line.

As shown in FIGS. 2A-B, the dummy word line $WL_d$ and each of the memory cell word lines $WL_1$ to $WL_{2n}$ may have about a same width $F_1$. In addition, about a same width/spacing $W_1$ may separate a gate selection line GSL and an adjacent dummy word line $WL_d$, about the same width/spacing $W_1$ may separate a dummy word line $WL_d$ and an adjacent first memory cell word line $WL_1$, about the same width/spacing $W_1$ may separate adjacent memory cell word lines $WL_x$ and $WL_{x+1}$, and about the same width/spacing $W_1$ may separate a last memory cell word line $WL_{2n}$ and an adjacent string select line SSL. Moreover, the widths $F_1$ and $W_1$ may be about the same, and more particularly, each of the widths $F_1$ and $W_1$ may be about one fourth (¼) of a period $P_1$ defined by adjacent even memory cell word lines $WL_{even}$ and $WL_{even+2}$ (i.e., even memory cell word lines separated by only one odd memory cell word line), or defined by adjacent odd memory cell word lines $WL_{odd}$ and $WL_{odd+2}$ (i.e., odd memory cell word lines separated by only one even memory cell word line). As further shown in FIGS. 2A-B, adjacent ground selection lines $GSL_0$ and $GSL_1$ may be separated by about a width/spacing $W_2$, and adjacent string selection lines $SSL_0$ and $SSL_1$ may be separated by about the same width/spacing $W_2$. The width/spacing $W_2$ may be at least about 3 times greater than the width/spacing $W_1$.

Each memory cell word line $WL_1$ to $WL_{2n}$ may thus provide a respective control electrode for a non-volatile memory cell (such as a flash memory cell) of a memory cell string on a same active region ACT between a ground select line (e.g., $GSL_1$) and a string select line (e.g., $SSL_1$). Each non-volatile memory cell may also include a charge storage layer between the respective memory cell word line and active region, a tunnel insulating layer between the active region and the charge storage layer, and a barrier insulating layer between the memory cell word line and the charge storage layer.

Each dummy word line $WL_d$ may have a structure the same as that discussed above with respect to the memory cell word lines (with a tunnel insulating layer, a charge storage layer, and a barrier insulating layer between each dummy word line and respective active regions). The dummy cell word lines (and associated tunnel insulating layers, charge storage layers, and barrier insulating layers), however, are not used to store data, but are instead provided to reduce ground induced leakage current at the adjacent ground select line during programming operations and/or to reduce erase bias at the adjacent memory cell during erase operations.

The pattern of ground select lines GSL, dummy word lines $WL_d$, memory cell word lines $WL_1$ to $WL_{2n}$, and string select lines SSL may be formed using self-aligned double patterning as discussed in greater detail below. For example, the ground select lines GSL, the string select lines SSL, and the odd memory cell word lines ($WL_1$, $WL_3$, $WL_5$ ... $WL_{2n-1}$) may be formed corresponding to a pattern of a photolithography mask, and the dummy word lines $WL_d$ and the even memory cell word lines ($WL_2$, $WL_4$, $WL_6$ ... $WL_{2n}$) may be formed using self-aligned double patterning.

According to some embodiments of the present invention illustrated in FIGS. 2A-B, a first memory cell string on the active region ACT may include a first plurality of memory cell word lines $WL_1$ to $WL_{2n}$ crossing the active region ACT between the first ground select line $GSL_1$ and the first string select line $SSL_1$, and about a same first spacing $W_1$ may be provided between adjacent ones of the first plurality of word lines. In addition, a second memory cell string on the active region ACT may include a second plurality of word lines $WL_1$ to $WL_{2n}$ crossing the active region ACT between a second ground select line $GSL_0$ and a second string select line $SSL_1$, and about the same first spacing $W_1$ may be provided between adjacent ones of the second plurality of word lines. More particularly, the first ground select line $GSL_1$ may be between the second ground select line $GSL_0$ and the first plurality of word lines, and the second ground select line $GSL_0$ may be between the first ground select line $GSL_1$ and the second plurality of word lines. Moreover, portions of the active region ACT between the first and second ground select lines $GSL_1$ and $GSL_0$ may be free of word lines, and the second spacing $W_2$ between the first and second ground select lines $GSL_1$ and $GSL_0$ may be at least about 3 times greater than the first spacing $W_1$. For example, the second spacing $W_2$ may be between about 3 and 4 times greater than the first spacing $W_1$, and more particularly, the second spacing $W_2$ may be more than 3 times greater than the first spacing $W_1$, and still more particularly, more than 4 times greater than the first spacing $W_1$.

In addition, the dummy word line $WL_d$ may be provided between the first memory cell word line $WL_1$ and the first ground select line $GSL_1$, and about the same first spacing $W_1$ may be provided between the first ground select line $GSL_1$ and the dummy word line $WL_d$. About the same first spacing $W_1$ may also be provided between the dummy word line $WL_d$ and the first memory cell word line $WL_1$, and between the last memory cell word line $WL_{2n-1}$ and the string select line $SSL_1$.

Figure 5A:
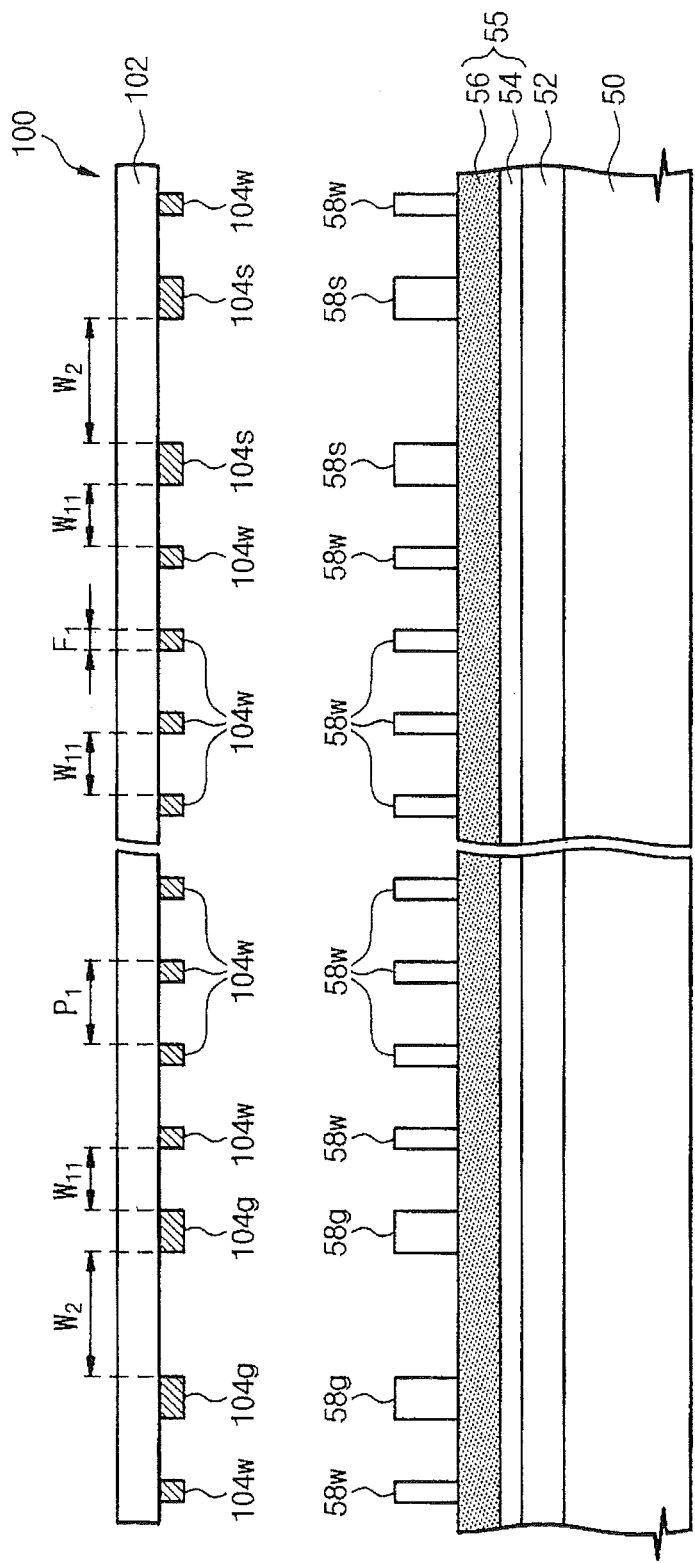

FIGS. 5A-D are cross-sectional views illustrating operations of forming the non-volatile memory structures of FIGS. 2A-B using self-aligned double patterning according to some embodiments of the present invention. As shown in FIG. 5A, a substrate 50 may include an etch target layer 52 thereon, and the etch target layer 52 may include layers of materials used to form the memory cells, word lines, selection transistors, and selection lines of FIGS. 2A-B.

More particularly, the target layer may include a tunnel insulating layer (such as a layer of silicon oxide), a charge storage gate layer (such as a layer of polysilicon or silicon nitride), a barrier insulating layer (such as a layer of silicon oxide or other dielectric material different than the charge storage gate layer), and conductive layer (such as a layer of polysilicon and/or metal). The charge storage layer may be between the conductive layer and the substrate with the tunnel insulating layer separating the charge storage layer and the substrate and with the barrier insulating layer separating the charge storage layer and the conductive layer. In addition, a first hard mask layer 55 may be formed on the etch target layer 52, and the first hard mask layer 55 may include a silicon nitride layer 56 on a pad oxide layer 54.

A photoresist layer on the first hard mask layer 55 may be patterned using the photo-mask 100 to provide the photoresist pattern 58 including odd word line photoresist patterns 58w, ground select line photoresist patterns 58g, and string select line photoresist patterns 58s. More particularly, the photomask 100 may include a photo-mask pattern 104 on a transparent substrate 102. The photo-mask pattern 104 may include odd word line photo-mask patterns 104w corresponding to odd word line photoresist patterns 58w, ground select line photo-mask patterns 104g corresponding to ground select line photoresist patterns 58g, and string select line photo-mask patterns 104s corresponding to string select line photoresist patterns 58s.

As further shown in FIG. 5A, adjacent odd word line photo-mask patterns 104w may be spaced apart by about a width/spacing $W_{11}$, and adjacent odd word line photoresist patterns 58w may be spaced apart by about the width/spacing $W_{11}$. A first of the odd word line photo-mask patterns 104w may be spaced apart from an adjacent ground select line photo-mask pattern 104g by about the width/spacing $W_{11}$, and a last of the odd word line photo-mask patterns 104w may be spaced apart from an adjacent string select line photo-mask pattern 104s by about the width/spacing Similarly, a first of the odd word line photoresist patterns 58w may be spaced apart from an adjacent ground select line photoresist pattern 58g by about the width/spacing $W_{11}$, and a last of the odd word line photo-mask patterns 58w may be spaced apart from an adjacent string select line photo-mask pattern 58s by about the width/spacing $W_{11}$.

Moreover, each of the odd word line photo-mask patterns 104w and each of the odd word line photoresist patterns 58w may have a width of about $F_1$, and the width/spacing $W_{11}$ may be about three times the width $F_1$. In addition, adjacent ones of the odd word line photo-mask patterns 104w and adjacent ones of the odd word line photoresist patterns 58w may define a period $P_1$, and the period $P_1$ may be about 4 times the width $F_1$. The width $F_1$ may be a minimum feature size available from the photolithography technology being used. Adjacent ground select line photo-mask patterns 104g, adjacent string select line photo-mask patterns 104s, adjacent ground select line photoresist patterns 58g, and adjacent string select line photoresist patterns 58s may be separated by a width/spacing $W_2$, and the width/spacing $W_2$ may be greater than four times the width $F_1$. Moreover, the second spacing $W_2$ may be at least about 3 times greater than the first spacing $W_1$. For example, the second spacing $W_2$ may be between about 3 and 4 times greater than the first spacing $W_1$, and more particularly, the second spacing $W_2$ may be more than 3 times greater than the first spacing $W_1$, and still more particularly, more than 4 times greater than the first spacing $W_1$.

More particularly, a continuous photoresist layer may be selectively exposed to radiation through the photomask 100 and then developed to provide the photoresist pattern 58 of FIG. 5A. Accordingly, an arrangement of the photoresist pattern 58 is defined by an arrangement of the photo-mask pattern 104. In addition, the photoresist pattern 58 corresponds to a pattern of gate select lines, string select lines, and odd word lines discussed above with respect to FIGS. 2A-B.

Portions of the first hard mask layer 55 (including silicon nitride layer 56 and pad oxide layer 54) exposed by the photoresist pattern 58 may be selectively removed (for example, using dry etching) to provide a first hard mask pattern 60 (including ground select line hard mask patterns 60g, string select line hard mask patterns 60s, and odd word line hard mask patterns 60w) as shown in FIG. 5B. If the first hard mask layer 55 includes separate layers 54 and 56, each element of the first hard mask pattern 60 may also include separate layers 54 and 56. About a same spacing/width $W_{11}$ may be provided between a ground select line hard mask pattern 60g and a first odd word line hard mask pattern 60w, between adjacent odd word line hard mask patterns 60w, and between a, last odd word line hard mask pattern 60w and a string select line hard mask pattern 60s. Each element of the first hard mask pattern 60 may include a layer of silicon nitride and/or silicon oxide. After selectively removing portions of the first hard mask layer, the photoresist pattern 58 may be removed.

As further shown in FIG. 5B, a sacrificial mask layer 62 may be formed on the first hard mask pattern 60 and on portions of the etch target layer 52 exposed by the first hard mask pattern 60, and the sacrificial mask layer 62 and the first hard mask pattern 60 may comprise different materials. For example, upper layers 56 of the first hard mask pattern 60 may be a layer of silicon nitride, and the sacrificial mask layer 62 may be a layer of polysilicon. Moreover, a thickness of the sacrificial mask layer 62 may be provided so that: gaps remain between portions of the sacrificial mask layer 62 on sidewalls of adjacent ones of the odd word line hard mask patterns 60w; gaps remain between portions of the sacrificial mask layer 62 on sidewalls of adjacent ground select line hard mask patterns 60g; gaps remain between portions of the sacrificial mask layer 62 on sidewalls of adjacent string select line hard mask patterns 60s; gaps remain between portions of the sacrificial mask layer 62 on sidewalls of adjacent select line hard mask patterns 60g and first odd word line hard mask patterns 60w; and gaps remain between portions of the sacrificial mask layer 62 on sidewalls of adjacent select line hard mask patterns 60s and last odd word line hard mask patterns 60w.

A thickness of the sacrificial mask layer 62 on sidewalls of the first hard mask patterns 60w, 60g, and 60s may be about the same as the width/spacing $W_1$ between adjacent word lines $WL_x$ and $WL_{x+1}$ shown in FIGS. 2A-B. A width/spacing of a gap remaining between portions of the sacrificial mask layer 62 on adjacent odd word line mask patterns 60W may be about the same as a width $F_1$ of an even word line $WL_2$, $WL_4$, ... $WL_{2n}$ shown in FIGS. 2A-B.

After forming the sacrificial mask layer 62, a second hard mask layer 64 may be formed on the sacrificial mask layer 62, as further shown in FIG. 5B. Moreover, the second hard mask layer 64 may be a layer of silicon oxide, and the second hard mask layer 64 may have a thickness that is at least one half of the width $F_1$ to thereby fill gaps in the sacrificial mask layer 62 between odd word line hard mask patterns 60w. Because wider gaps are provided between adjacent ground select line hard mask patterns 60g and between adjacent string select line hard mask patterns 60s, however, gaps 68 may remain in the second hard mask layer 64. If a thickness of the second hard mask layer 64 is about the width $F_1$ of a word line, adjacent ground select line patterns 60g and adjacent string select line patterns 60s may be separated by a width/spacing greater than four times $F_1$.

The second hard mask layer 64 may then be subjected to an etch back operation to remove portions of the hard mask layer 64 from between adjacent ground select line hard mask patterns 60g, from between adjacent string select line hard mask patterns 60s, and from upper surfaces of the sacrificial mask layer 62, as shown in FIG. 5C. Portions of the second hard mask layer 64 remaining after the etch back operation may thus have about the thickness $F_1$. More particularly, portions of the second hard mask layer 64 remaining after the etch back operation may define a second hard mask pattern 70 on the sacrificial mask layer 62. The second hard mask pattern 70 may include a dummy word line pattern 70d between the ground select line pattern 60g and the first odd word line pattern 60w, and even word line patterns 70w between adjacent odd word line patterns 60w and between the last odd word line pattern 60w and the string select line pattern 60s.

Figure 5D:
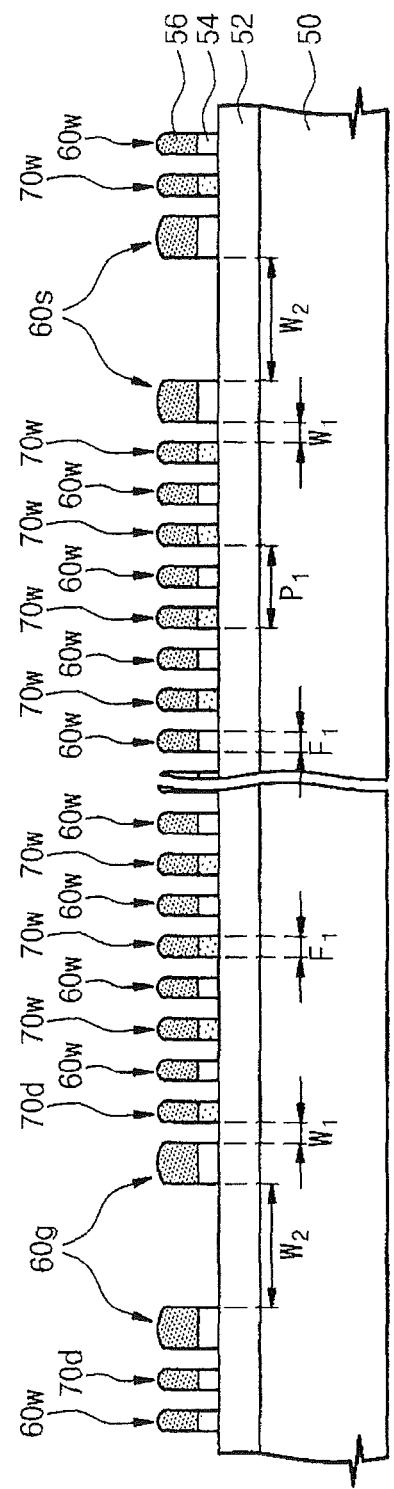

Exposed portions of the sacrificial mask layer 62 may then be removed (for example, using a dry etch) as shown in FIG. 5D to expose portions of the etch target layer 52 not covered by the first and/or second hard mask patterns 60 and/or 70. Exposed portions of the etch target layer 52 may then be removed (for example, using a dry etch) using the first and second hard mask patterns 60 and 70 as an etch mask, and the first and second hard mask patterns 60 and 70 may then be removed to provide the structure of FIGS. 2A-B.

Figure 3A:
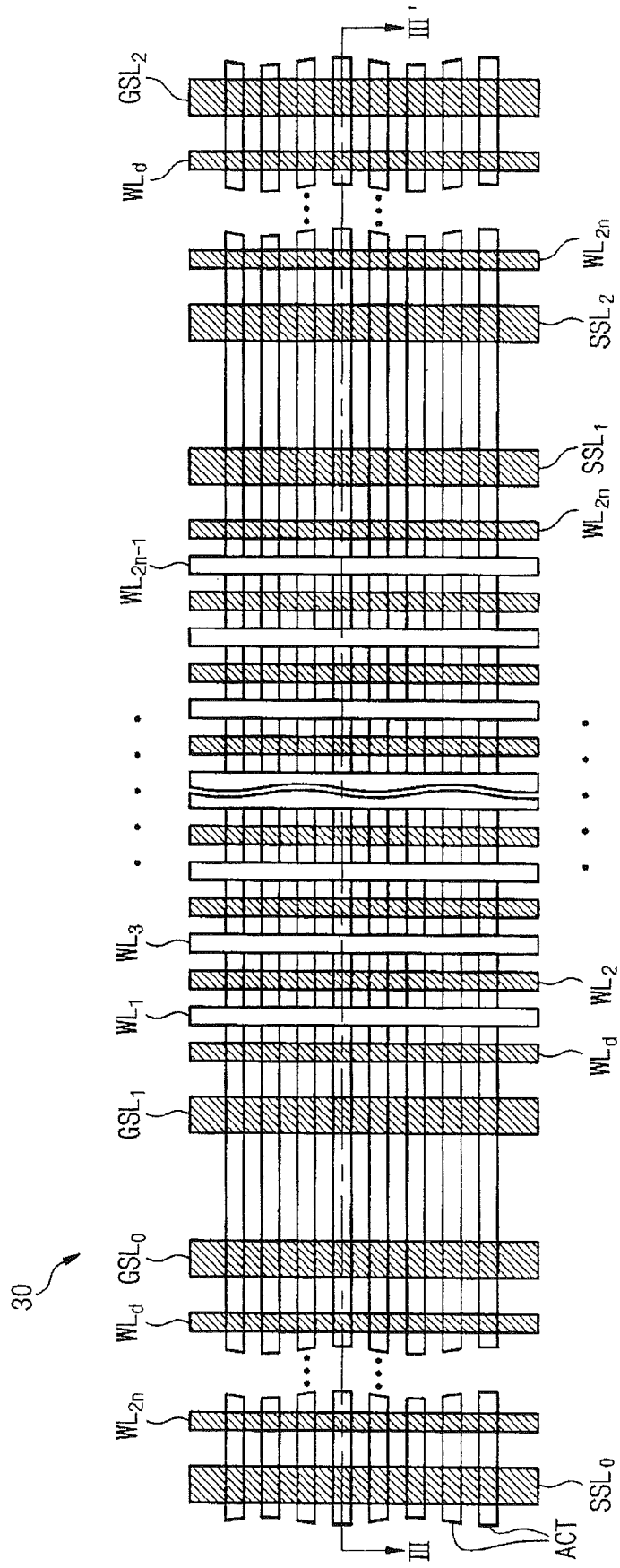
FIG. 3A is a plan view of a non-volatile memory device according to some other embodiments of the present invention.
Figure 3B:
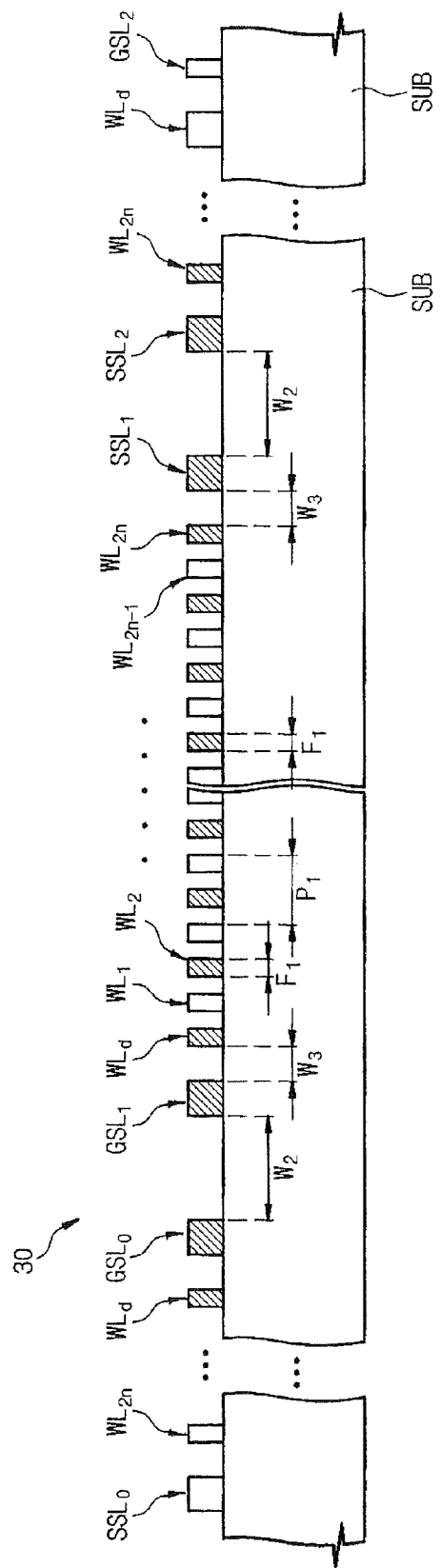
FIG. 3B is a cross-sectional view taken along section line III-III' of FIG. 3A.

FIG. 3A is a plan view of a non-volatile memory device 30 (such as a flash memory device) according to some embodiments of the present invention, and FIG. 3B is a cross-sectional view taken along section line II-II' of FIG. 3A. The flash memory device 30 may include a plurality of parallel active regions ACT in a semiconductor substrate SUB separated by device isolation layers. In addition, ground select lines $GSL_{0-2}$, string select lines $SSL_{0-2}$, dummy word lines $WL_d$, and memory cell word lines $WL_{1-2n}$ (where n is an integer) may cross the active regions ACT. More particularly, a respective charge storage gate may be provided between each memory cell word line $WL_{1-2n}$ and each active region ACT to provide a respective memory cell at each intersection of a memory cell word line $WL_{1-2n}$ and an active region ACT. Similarly, a charge storage gate may be provided between each dummy word line $WL_d$ and active region ACT so that the structures of the dummy word lines $WL_d$ and the memory cell word lines $WL_{1-2n}$ are the same.

An even number of memory cell word lines $WL_{1-2n}$ along an active region ACT between a ground select line GSL and a string select line SSL (e.g., between $GSL_1$ and $SSL_1$) may define a memory cell string including an even number of memory cells. As further shown in FIGS. 3A-B, adjacent memory cell strings may be separated by two ground select lines GSL (e.g., $GSL_0$ and $GSL_1$) or by two string select lines SSL (e.g., $SSL_1$ and $SSL_2$). More particularly, $2^k$ (where k is a positive integer) memory cell word lines $WL_{1-2n}$ may define a memory cell string including $2^k$ memory cells used to store data. The dummy word line $WL_d$, however, is not used to store data.

Moreover, an order of memory cell word lines $WL_{1-2n}$ and dummy word line $WL_d$ of adjacent memory cell strings may have a mirror image symmetry. For example, an order of memory cell word lines $WL_{1-2n}$ and dummy word line $WL_d$ between ground select line $GSL_0$ and string select line $SSL_0$ may have mirror image symmetry relative to an order of memory cell word lines $WL_{1-2n}$ and dummy word line $WL_d$ between ground select line $GSL_1$ and string select line $SSL_1$. Similarly, an order of memory cell word lines $WL_{1-2n}$ and dummy word line $WL_d$ between ground select line $GSL_1$ and string select line $SSL_1$ may have mirror image symmetry relative to an order of memory cell word lines $WL_{1-2n}$ and dummy word line $WL_d$ between ground select line $GSL_2$ and string select line $SSL_2$.

By providing a dummy word line $WL_d$ between a ground select line GSL and a first memory cell word line $WL_1$ of a memory cell string, a ground induced leakage current and/or an erase disturbance at the first memory cell word line $WL_1$ may be reduced. Moreover, a controller of the non-volatile memory device may be coupled to the ground select lines, the string select lines, the memory cell word lines, and the dummy word lines. During an erase operation, for example, the controller may be configured to allow the ground select line $GSL_1$ to float, to apply an erase voltage Vers of about 20 volts to a p-well of the substrate SUB, and to apply 0 volts to the memory cell word lines $WL_{1-2n}$. In addition, the controller may be configured to apply a bias voltage Vb to the dummy word line $WL_d$ with the bias voltage Vb being between a supply voltage Vcc and a pass voltage Vpass (i.e., Vcc<Vb<Vpass) to thereby reduce an erase disturbance at the first memory cell word line $WL_1$ and/or at respective charge storage layers.

During a write (or program) operation, the controller may be configured to apply the supply voltage Vcc to the ground select line $GSL_1$, to apply 0 volts to a p-well of the substrate SUB, to apply a pass voltage Vpass to the non-selected word lines, and to apply a program voltage Vpgm to the selected word line. In addition, the controller may be configured to apply a bias voltage Vb to the dummy word line $WL_d$ with the bias voltage Vb being between the supply voltage Vcc and the pass voltage Vpass (i.e., Vcc<Vb<Vpass) to thereby reduce ground induced leakage current at the ground select line adjacent to the dummy word line.

As shown in FIGS. 3A-B, the dummy word line $WL_d$ and each of the memory cell word lines $WL_1$ to $WL_{2n}$ may have about a same width $F_1$. In addition, about a same width/spacing $W_1$ may separate a dummy word line $WL_d$ and an adjacent first memory cell word line $WL_1$, and about the same width/spacing $W_1$ may separate adjacent memory cell word lines $WL_x$ and $WL_{x+1}$. Moreover, the widths $F_1$ and $W_1$ may be about the same, and more particularly, each of the widths $F_1$ and $W_1$ may be about one fourth (¼) of a period $P_1$ defined by adjacent even memory cell word lines $WL_{even}$ and $WL_{even+2}$ (i.e., even memory cell word lines separated by only one odd memory cell word line), or defined by adjacent odd memory cell word lines $WL_{odd}$ and $WL_{odd+2}$ (i.e., odd memory cell word lines separated by only one even memory cell word line).

As further shown in FIGS. 3A-B, adjacent ground selection lines $GSL_0$ and $GSL_1$ may be separated by about a width/spacing $W_2$, and adjacent string selection lines $SSL_0$ and $SSL_1$ may be separated by about the same width/spacing $W_2$. Moreover, the second width/spacing $W_2$ may be at least about 3 times greater than the first spacing $W_1$. For example, the second spacing $W_2$ may be between about 3 and 4 times greater than the first spacing $W_1$, and more particularly, the second spacing $W_2$ may be more than 3 times greater than the first spacing $W_1$, and still more particularly, more than 4 times greater than the first spacing $W_1$. Furthermore, a width/spacing $W_3$ may separate a gate selection line GSL and an adjacent dummy word line $WL_d$, and about the same width/spacing $W_3$ may separate a last memory cell word line $WL_{2n}$ and an adjacent string select line SSL. The width/spacing $W_3$ may be greater than the width/spacing $W_1$, and more particularly, the width/spacing $W_3$ may be greater than the width/spacing $W_1$ and less than two times $W_1$ (i.e., $W_1<W_3<2\times W_1$), and still more particularly, the width/spacing $W_3$ may be greater than 1.5 times the width/spacing $W_1$ and less than two times $W_1$ (i.e., $1.5\times W_1<W_3<2\times W_1$).

Each memory cell word line $WL_1$ to $WL_{2n}$ may thus provide a respective control electrode for a non-volatile memory cell (such as a flash memory cell) of a memory cell string on a same active region ACT between a ground select line (e.g., $GSL_1$) and a string select line (e.g., $SSL_1$). Each non-volatile memory cell may also include a charge storage layer between the respective memory cell word line and active region, a tunnel insulating layer between the active region and the charge storage layer, and a barrier insulating layer between the memory cell word line and the charge storage layer.

Each dummy word line $WL_d$ may have a structure the same as that discussed above with respect to the memory cell word lines (with a tunnel insulating layer, a charge storage layer, and a barrier insulating layer between each dummy word line and respective active regions). The dummy cell word lines (and associated tunnel insulating layers, charge storage layers, and barrier insulating layers), however, are not used to store data, but are instead provided to reduce ground induced leakage current at the adjacent ground select line during programming operations and/or to reduce erase bias at the adjacent memory cell during erase operations.

The pattern of ground select lines GSL, dummy word lines $WL_d$, memory cell word lines $WL_1$ to $WL_{2n}$, and string select lines SSL may be formed using self-aligned double patterning as discussed in greater detail below. For example, the ground select lines GSL, the string select lines SSL, the dummy word lines $WL_d$, and the even memory cell word lines ($WL_2, WL_4, WL_6 \ldots WL_{2n}$) may be formed corresponding to a pattern of a photolithography mask, and the odd memory cell word lines ($WL_1, WL_3, WL_5 \ldots WL_{2n-1}$) may be formed using self-aligned double patterning.

According to some embodiments of the present invention illustrated in FIGS. 3A-B, a first memory cell string on an active region ACT may include a first plurality of word lines $WL_1$ to $WL_{2n}$ crossing the active region ACT between a first ground select line $GSL_1$ and a first string select line $SSL_1$, and about a same first spacing $W_1$ may be provided between adjacent ones of the first plurality of word lines $WL_1$ to $WL_{2n}$. A second memory cell string on the active region ACT may include a second plurality of word lines $WL_1$ to $WL_{2n}$ crossing the active region ACT between a second ground select line $GSL_0$ and a second string select line $SSL_0$, and about the same first spacing $W_1$ may be provided between adjacent ones of the second plurality of word lines $WL_1$ to $WL_{2n}$. The first ground select line $GSL_1$ may be between the second ground select line $GSL_0$ and the first plurality of word lines, and the second ground select line $GSL_0$ may be between the first ground select line $GSL_1$ and the second plurality of word lines. Moreover, portions of the active region ACT between the first and second ground select lines $GSL_1$ and $GSL_0$ may be free of word lines, and a second spacing $W_2$ between the first and second ground select lines $GSL_1$ and $GSL_0$ may be at least about 3 times greater than the first spacing $W_1$. For example, the second spacing $W_2$ may be between about 3 and 4 times greater than the first spacing $W_1$, and more particularly, the second spacing $W_2$ may be more than 3 times greater than the first spacing $W_1$, and still more particularly, more than 4 times greater than the first spacing $W_1$.

In addition, the first plurality of word lines $WL_1$ to $WL_{2n}$ may include an even number of memory cell word lines, and a dummy word line $WL_d$ may be provided between a first of the memory cell word lines $WL_1$ to $WL_2$, and the ground select line $GSL_1$. About the same first spacing $W_1$ may be provided between the dummy word line $WL_d$ and the first of the memory cell word lines $WL_1$ to $WL_{2n}$. Moreover, a third spacing $W_3$ may be provided between the ground select line $GSL_1$ and the dummy word line $WL_d$, and the third spacing $W_3$ may be greater than the first spacing $W_1$ and no greater than two times the first spacing $W_1$ (i.e., $W_1<W_3<2\times W_1$).

Figure 6A:
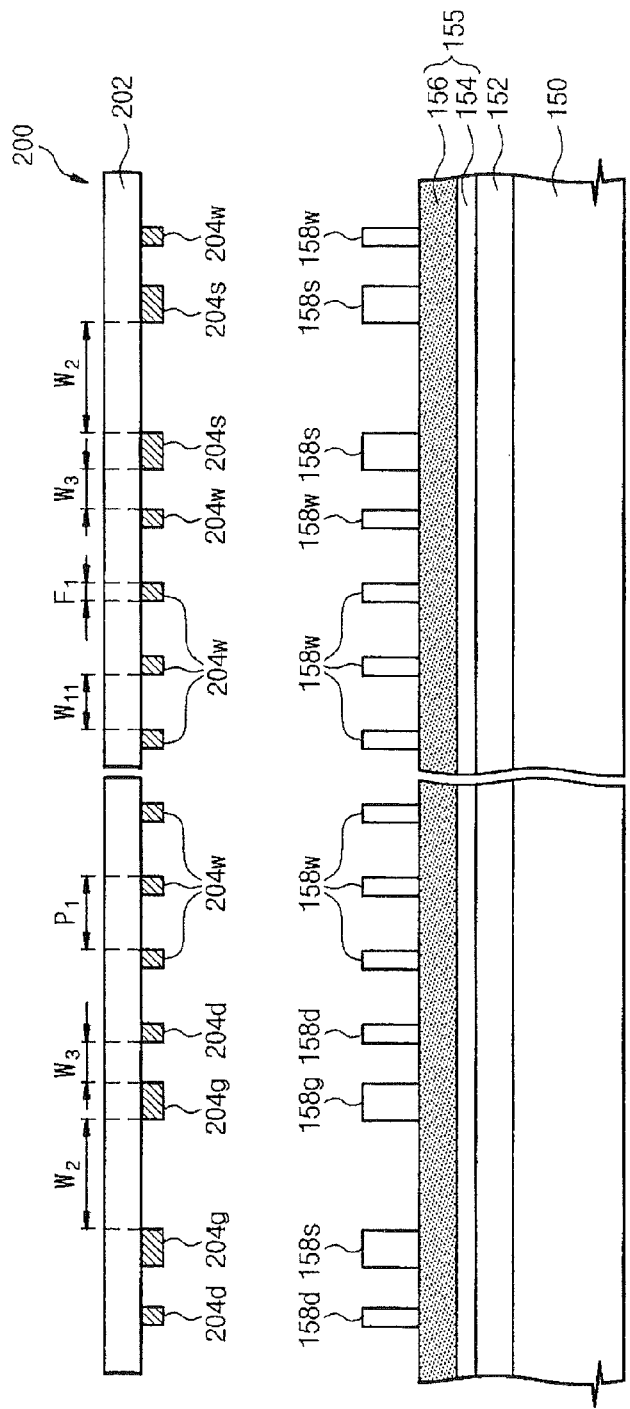
FIGS. 6A-D are cross-sectional views illustrating operations of forming non-volatile memory structures of FIGS. 3A-B according to embodiments of the present invention.

FIGS. 6A-D are cross-sectional views illustrating operations of forming the non-volatile memory structures of FIGS. 3A-B using self-aligned double patterning according to some embodiments of the present invention. As shown in FIG. 6A, a substrate 150 may include an etch target layer 152 thereon, and the etch target layer 152 may include layers of materials used to form the memory cells, word lines, selection transistors, and selection lines of FIGS. 3A-B.

More particularly, the etch target layer 152 may include a tunnel insulating layer (such as a layer of silicon oxide), a charge storage gate layer (such as a layer of polysilicon or silicon nitride), a barrier insulating layer (such as a layer of silicon oxide or other dielectric material different than the charge storage gate layer), and conductive layer (such as a layer of polysilicon and/or metal). The charge storage layer may be between the conductive layer and the substrate with the tunnel insulating layer separating the charge storage layer and the substrate and with the barrier insulating layer separating the charge storage layer and the conductive layer. In addition, a first hard mask layer 155 may be formed on the etch target layer 152, and the first hard mask layer 155 may include a silicon nitride layer 156 on a pad oxide layer 154.

A photoresist layer on the first hard mask layer 155 may be patterned using the photo-mask 200 to provide the photoresist pattern 158 including dummy word line photoresist pattern 158d, even word line photoresist patterns 158w, ground select line photoresist patterns 158g, and string select line photoresist patterns 158s. More particularly, the photo-mask 200 may include a photo-mask pattern 204 on a transparent substrate 202. The photo-mask pattern 204 may include dummy word line photo-mask patterns 204d corresponding to dummy word line photoresist patterns 158d, even word line photo-mask patterns 204w corresponding to even word line photoresist patterns 158w, ground select line photo-mask patterns 204g corresponding to ground select line photoresist patterns 158g, and string select line photo-mask patterns 204s corresponding to string select line photoresist patterns 158s.

As further shown in FIG. 6A, adjacent even word line photo-mask patterns 204w may be spaced apart by about a width/spacing $W_{11}$, and adjacent even word line photoresist patterns 158w may be spaced apart by about the width/spacing $W_{11}$. A first of the even word line photo-mask patterns 204w may be spaced apart from an adjacent dummy word line photo-mask pattern 204d by about the width/spacing $W_{11}$, and a first of the even word line photoresist patterns 158w may be spaced apart from an adjacent dummy word line photoresist pattern 158d by about the width/spacing $W_{11}$. A dummy word line photo-mask pattern 204d may be spaced apart from an adjacent ground select line photo-mask pattern 204g by about the width/spacing $W_3$, and a last of the even word line photo-mask patterns 204w may be spaced apart from an adjacent string select line photo-mask pattern 204s by about the width/spacing $W_3$. Similarly, a dummy word line photoresist pattern 158d may be spaced apart from an adjacent ground select line photoresist pattern 158g by about the width/spacing $W_3$, and a last of the even word line photo-mask patterns 158w may be spaced apart from an adjacent string select line photo-mask pattern 158s by about the width/spacing $W_3$.

Moreover, each of the even word line photo-mask patterns 204w and each of the even word line photoresist patterns 158w may have a width of about $F_1$, and the width/spacing $W_3$ may be in the range of at least about the with $F_1$ to no greater than about two times the width $F_1$ ($F_1 \# W_3 \# 2 \times F_1$). In addition, adjacent ones of the even word line photo-mask patterns 204w and adjacent ones of the even word line photoresist patterns 158w may define a period $P_1$, and the period $P_1$ may be about 4 times the width $F_1$. The width $F_1$ may be a minimum feature size available from the photolithography technology being used. Adjacent ground select line photo-mask patterns 204g, adjacent string select line photo-mask patterns 204s, adjacent ground select line photoresist patterns 158g, and adjacent string select line photoresist patterns 158s may be separated by a width/spacing $W_2$, and the width/spacing $W_2$ may be greater than three times the width $F_1$. For example, the second spacing $W_2$ may be between about 3 and 4 times greater than the first spacing $W_1$, or the second spacing $W_2$ may be more than 3 times greater than the first spacing $W_1$, and still more particularly, more than 4 times greater than the first spacing $W_1$.

More particularly, a continuous photoresist layer may be selectively exposed to radiation through the photomask 200 and then developed to provide the photoresist pattern 158 of FIG. 6A. Accordingly, an arrangement of the photoresist pattern 158 is defined by an arrangement of the photo-mask pattern 204. In addition, the photoresist pattern 158 corresponds to a pattern of gate select lines, string select lines, and even word lines discussed above with respect to FIGS. 3A-B.

Figure 6B:
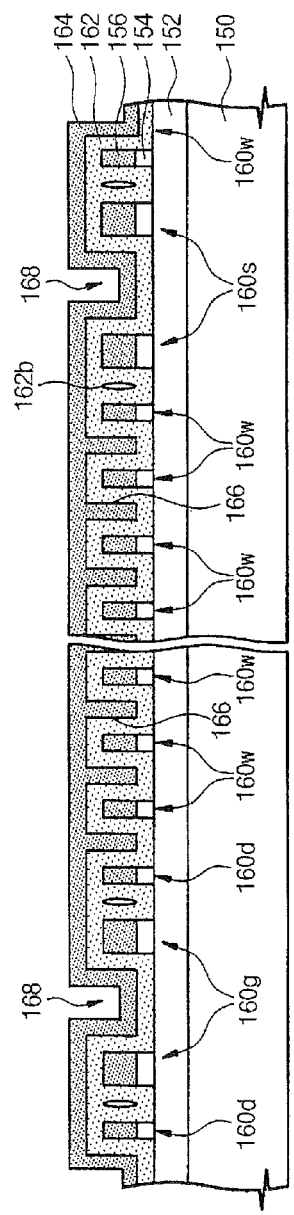

Portions of the first hard mask layer 155 (including silicon nitride layer 156 and pad oxide layer 154) exposed by the photoresist pattern 158 may be selectively removed (for example, using dry etching) to provide a first hard mask pattern 160 (including ground select line hard mask patterns 160g, string select line hard mask patterns 160s, dummy word line hard mask pattern 160d, and even word line hard mask patterns 160w) as shown in FIG. 6B. If the first hard mask layer 155 includes separate layers 154 and 156, each element of the first hard mask pattern 160 may also include separate layers 154 and 156. About a same spacing/width $W_{11}$ may be provided between a dummy word line hard mask pattern 160d and a first even word line hard mask pattern 160w, and between adjacent even word line hard mask patterns 160w. About the same spacing/width $W_3$ may be provided between a ground select line hard mask pattern 160g and a dummy word line hard mask pattern 160d, and between a last even word line hard mask pattern 160w and a string select line hard mask pattern 160s. Each element of the first hard mask pattern 160 may include a layer of silicon nitride and/or silicon oxide. After selectively removing portions of the first hard mask layer, the photoresist pattern 158 may be removed.

As further shown in FIG. 6B, a sacrificial mask layer 162 may be formed on the first hard mask pattern 160 and on portions of the etch target layer 152 exposed by the first hard mask pattern 160, and the sacrificial mask layer 162 and the first hard mask pattern 160 may comprise different materials. For example, upper layers 156 of the first hard mask pattern 160 may be a layer of silicon nitride, and the sacrificial mask layer 162 may be a layer of polysilicon. Moreover, a thickness of the sacrificial mask layer 162 may be provided so that: gaps remain between portions of the sacrificial mask layer 162 on sidewalls of adjacent ones of the even word line hard mask patterns 160w; gaps remain between portions of the sacrificial mask layer 162 on sidewalls of adjacent ground select line hard mask patterns 160g; gaps remain between portions of the sacrificial mask layer 162 on sidewalls of adjacent string select line hard mask patterns 160s; and gaps remain between portions of the sacrificial mask layer 162 on sidewalls of adjacent dummy word line hard mask patterns 160d and first even word line hard mask patterns 160w. The sacrificial mask layer 162, however, may fill gaps between ground select line hard mask patterns 160g and dummy word line hard mask patterns 160c1, and the sacrificial layer 162 may fill gaps between a last of the even word line hard mask pattern 160w and adjacent string select line hard mask pattern 160s.

A thickness of the sacrificial mask layer 162 on sidewalls of the first hard mask patterns 160d, 160w, 160g, and 160s may be about the same as the width/spacing $W_1$ between adjacent word lines $WL_x$ and $WL_{x+1}$ shown in FIGS. 3A-B. A width/spacing of a gap remaining between portions of the sacrificial mask layer 162 on adjacent even word line mask patterns 160w may be about the same as a width $F_1$ of an odd word line $WL_1$, $WL_3$, ... $WL_{2n-1}$ shown in FIGS. 3A-B.

After forming the sacrificial mask layer 162, a second hard mask layer 164 may be formed on the sacrificial mask layer 162, as further shown in FIG. 6B. Moreover, the second hard mask layer 164 may be a layer of silicon oxide, and the second hard mask layer 164 may have a thickness that is at least one half of the width $F_1$ to thereby fill gaps in the sacrificial mask layer 162 between odd word line hard mask patterns 160w. Because wider gaps are provided between adjacent ground select line hard mask patterns 160g and between adjacent string select line hard mask patterns 160s, however, gaps 168 may remain in the second hard mask layer 164. If a thickness of the second hard mask layer 164 is about the width $F_1$ of a word line, adjacent ground select line patterns 160g and adjacent string select line patterns 160s may be separated by a width/spacing greater than four times $F_1$.

Figure 6C:
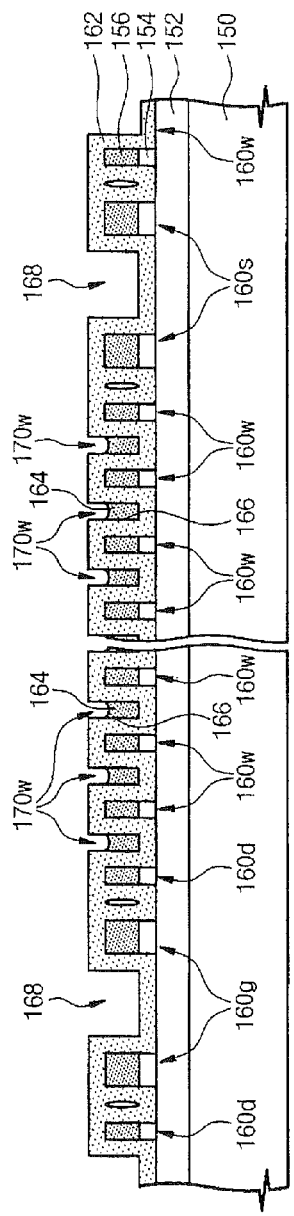

The second hard mask layer 164 may then be subjected to an etch back operation to remove portions of the hard mask layer 164 from between adjacent ground select line hard mask patterns 160g, from between adjacent string select line hard mask patterns 160s, and from upper surfaces of the sacrificial mask layer 162, as shown in FIG. 6C. Portions of the second hard mask layer 164 remaining after the etch back operation may thus have about the thickness $F_1$. More particularly, portions of the second hard mask layer 164 remaining after the etch back operation may define a second hard mask pattern 170 on the sacrificial mask layer 162. The second hard mask pattern 170 may include odd word line patterns 170w between adjacent even word line patterns 160w and between the last odd word line pattern 160w and the string select line pattern 160s.

Figure 6D:
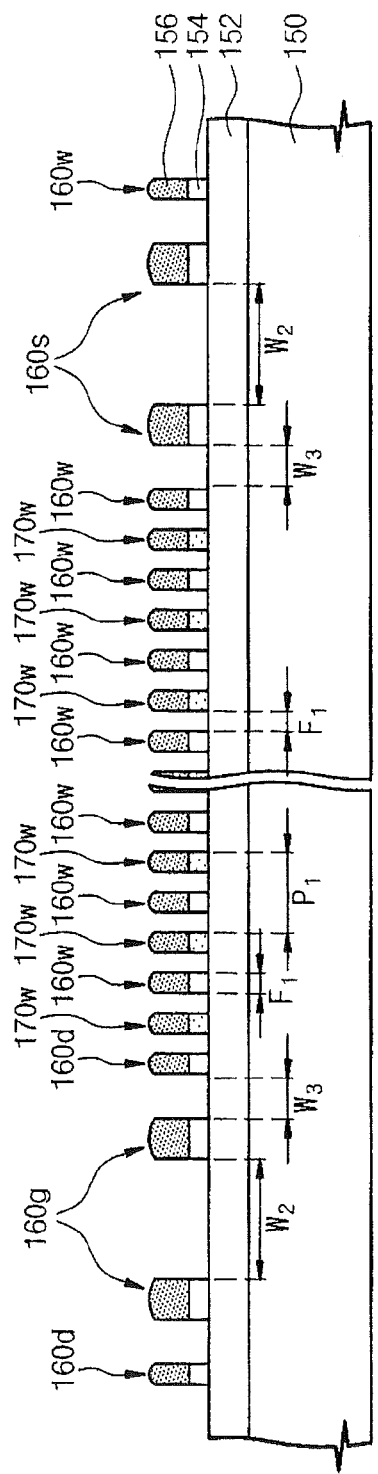

Exposed portions of the sacrificial mask layer 162 may then be removed (for example, using a dry etch) as shown in FIG. 6D to expose portions of the etch target layer 152 not covered by the first and/or second hard mask patterns 160 and/or 170. Exposed portions of the etch target layer 152 may then be removed (for example, using a dry etch) using the first and second hard mask patterns 160 and 170 as an etch mask, and the first and second hard mask patterns 160 and 170 may then be removed to provide the structure of FIGS. 3A-B.

Figure 4A:
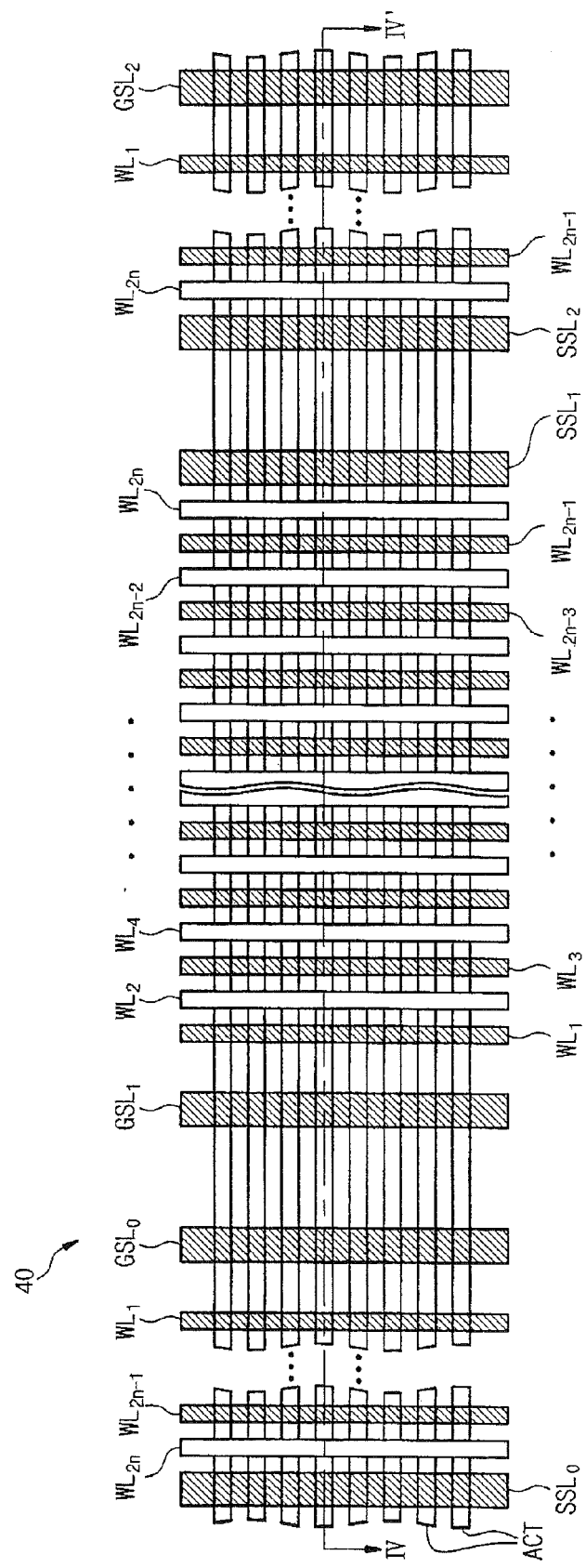
FIG. 4A is a plan view of a non-volatile memory device according to some other embodiments of the present invention.
Figure 4B:
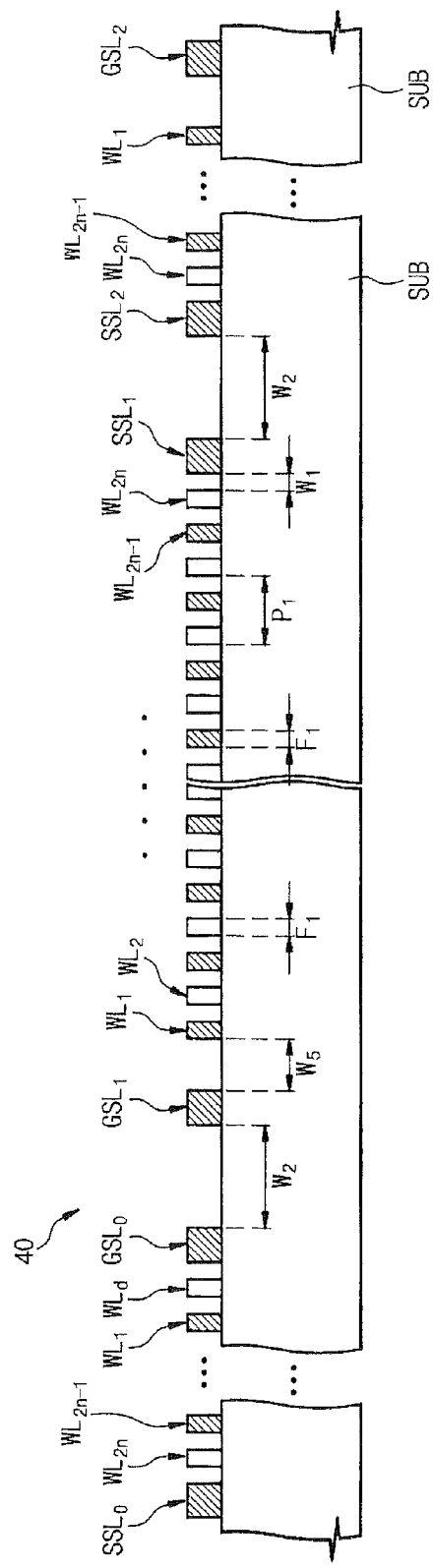
FIG. 4B is a cross-sectional view taken along section line IV-IV' of FIG. 4A.

FIG. 4A is a plan view of a non-volatile memory device 40 (such as a flash memory device) according to some embodiments of the present invention, and FIG. 4B is a cross-sectional view taken along section line IV-IV' of FIG. 4A. The flash memory device 40 may include a plurality of parallel active regions ACT in a semiconductor substrate SUB separated by device isolation layers. In addition, ground select lines $GSL_{0-2}$, string select lines $SSL_{0-2}$, and memory cell word lines $WL_{1-2n}$ (where n is an integer) may cross the active regions ACT. More particularly, a respective charge storage gate may be provided between each memory cell word line $WL_{1-2n}$ and each active region ACT to provide a respective memory cell at each intersection of a memory cell word line $WL_{1-2n}$ and an active region ACT. The structure of FIGS. 4A-B is similar to that of FIGS. 2A-B with the omission of dummy word lines.

An even number of memory cell word lines $WL_{1-2n}$ along an active region ACT between a ground select line GSL and a string select line SSL (e.g., between $GSL_1$ and $SSL_1$) may define a memory cell string including an even number of memory cells. As further shown in FIGS. 4A-B, adjacent memory cell strings may be separated by two ground select lines GSL (e.g., $GSL_0$ and $GSL_1$) or by two string select lines SSL (e.g., $SSL_1$ and $SSL_2$). More particularly, $2^k$ (where k is a positive integer) memory cell word lines $WL_{1-2n}$ may define a memory cell string including $2^k$ memory cells used to store data.

Moreover, an order of memory cell word lines $WL_{1-2n}$ of adjacent memory cell strings may have a mirror image symmetry. For example, an order of memory cell word lines $WL_{1-2n}$ between ground select line $GSL_0$ and string select line $SSL_0$ may have mirror image symmetry relative to an order of memory cell word lines $WL_{1-2n}$ between ground select line $GSL_1$ and string select line $SSL_1$. Similarly, an order of memory cell word lines $WL_{1-2n}$ between ground select line $GSL_1$ and string select line $SSL_1$ may have mirror image symmetry relative to an order of memory cell word lines $WL_{1-2n}$ between ground select line $GSL_2$ and string select line $SSL_2$. By providing a sufficient spacing/width $WL_4$ between a ground select line GSL and a first memory cell word line $WL_1$ of a memory cell string, a ground induced leakage current and/or an erase disturbance at the first memory cell word line $WL_1$ may be reduced.

A controller of the non-volatile memory device may be coupled to the ground select lines, the string select lines, and the memory cell word lines. During an erase operation, for example, the controller may be configured to allow the ground select line $GSL_1$ to float, to apply an erase voltage Vers of about 20 volts to a p-well of the substrate SUB, and to apply 0 volts to the memory cell word lines $WL_{1-2n}$. During a write (or program) operation, the controller may be configured to apply the supply voltage Vcc to the ground select line $GSL_1$, to apply 0 volts to a p-well of the substrate SUB, to apply a pass voltage Vpass to the non-selected word lines, and to apply a program voltage Vpgm to the selected word line.

As shown in FIGS. 4A-B, each of the memory cell word lines $WL_1$ to $WL_{2n}$ may have about a same width $F_1$, and a width/spacing $W_5$ may separate a gate selection line GSL and an adjacent first memory cell word line $WL_1$ of an associated memory cell string. About the same width/spacing $W_1$ may separate adjacent memory cell word lines $WL_x$ and $WL_{x+1}$, and about the same width/spacing $W_1$ may separate a last memory cell word line $WL_{2n}$ and an adjacent string select line SSL. Moreover, the widths $F_1$ and $W_1$ may be about the same, and more particularly, each of the widths $F_1$ and $W_1$ may be about one fourth (¼) of a period $P_1$ defined by adjacent even memory cell word lines $WL_{even}$ and $WL_{even+2}$ (i.e., even memory cell word lines separated by only one odd memory cell word line), or defined by adjacent odd memory cell word lines $WL_{odd}$ and $WL_{odd+2}$ (i.e., odd memory cell word lines separated by only one even memory cell word line). As further shown in FIGS. 4A-B, adjacent ground selection lines $GSL_0$ and $GSL_1$ may be separated by about a width/spacing $W_2$, and adjacent string selection lines $SSL_0$ and $SSL_1$ may be separated by about the same width/spacing $W_2$. The spacing/width $W_2$ may be at least about 3 times greater than the spacing/width $W_1$. Moreover, the spacing/width $W_5$ may be greater than about three times the spacing/width $W_1$ (i.e., $W_5 > 3 \times W_1$). For example, the second and/or fifth spacings $W_2$ and/or $W_5$ may be between about 3 and 4 times greater than the first spacing $W_1$, or the second and/or fifth spacing $W_2$ and/or $W_5$ may be more than 3 times greater than the first spacing $W_1$, and still more particularly, more than 4 times greater than the first spacing $W_1$.

Each memory cell word line $WL_1$ to $WL_{2n}$ may thus provide a respective control electrode for a non-volatile memory cell (such as a flash memory cell) of a memory cell string on a same active region ACT between a ground select line (e.g., $GSL_1$) and a string select line (e.g., $SSL_1$). Each non-volatile memory cell may also include a charge storage layer between the respective memory cell word line and active region, a tunnel insulating layer between the active region and the charge storage layer, and a barrier insulating layer between the memory cell word line and the charge storage layer.

The pattern of ground select lines GSL, memory cell word lines $WL_1$ to $WL_{2n}$, and string select lines SSL may be formed using self-aligned double patterning as discussed in greater detail below. For example, the ground select lines GSL, the string select lines SSL, and the odd memory cell word lines ($WL_1$, $WL_3$, $WL_5$ ... $WL_{2n-1}$) may be formed corresponding to a pattern of a photolithography mask, and even memory cell word lines ($WL_2$, $WL_4$, $WL_6$ ... $WL_{2n}$) may be formed using self-aligned double patterning.

According to some embodiments of the present invention illustrated in FIGS. 4A-B, a first memory cell string on the active region ACT may include a first plurality of memory cell word lines $WL_1$ to $WL_{2n}$ crossing the active region ACT between the first ground select line $GSL_1$ and the first string select line $SSL_1$, and about a same first spacing $W_1$ may be provided between adjacent ones of the first plurality of word lines. In addition, a second memory cell string on the active region ACT may include a second plurality of word lines $WL_1$ to $WL_{2n}$ crossing the active region ACT between a second ground select line $GSL_0$ and a second string select line $SSL_0$, and about the same first spacing $W_1$ may be provided between adjacent ones of the second plurality of word lines. More particularly, the first ground select line $GSL_1$ may be between the second ground select line $GSL_0$ and the first plurality of word lines, and the second ground select line $GSL_0$ may be between the first ground select line $GSL_1$ and the second plurality of word lines. Moreover, portions of the active region ACT between the first and second ground select lines $GSL_1$ and $GSL_0$ may be free of word lines, and the second spacing $W_2$ between the first and second ground select lines $GSL_1$ and $GSL_0$ may be at least about 3 times greater than the first spacing $W_1$. For example, the second spacing $W_2$ may be between about 3 and 4 times greater than the first spacing $W_1$, and more particularly, the second spacing $W_2$ may be about 3 times greater than the first spacing $W_1$.

As further shown in FIGS. 4A-B, the first plurality of word lines $WL_1$ to $WL_{2n}$ may include an even number of memory cell word lines, and a spacing/width $W_5$ greater than 3 times the first spacing $W_1$ may be provided between the ground select line $GSL_1$ and the first memory cell word line $WL_1$ of the respective memory cell string. Moreover, about the first spacing/width $WL_1$ may be provided between the last memory cell word line $WL_{2n}$ of the respective memory cell string and the string select line $SSL_1$, and portions of the active region ACT between the ground select line $GSL_1$ and the first memory cell word line $WL_1$ may be free of word lines.

Figure 7B:
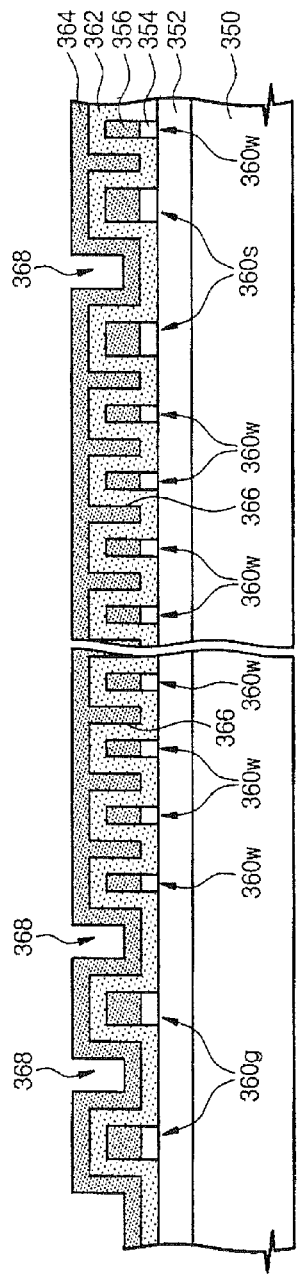

FIGS. 7A-D are cross-sectional views illustrating operations of forming the non-volatile memory structures of FIGS. 4A-B using self-aligned double patterning according to some embodiments of the present invention. As shown in FIG. 7A, a substrate 350 may include an etch target layer 352 thereon, and the etch target layer 352 may include layers of materials used to form the memory cells, word lines, selection transistors, and selection lines of FIGS. 4A-B.

More particularly, the target layer may include a tunnel insulating layer (such as a layer of silicon oxide), a charge storage gate layer (such as a layer of polysilicon or silicon nitride), a barrier insulating layer (such as a layer of silicon oxide or other dielectric material different than the charge storage gate layer), and conductive layer (such as a layer of polysilicon and/or metal). The charge storage layer may be between the conductive layer and the substrate with the tunnel insulating layer separating the charge storage layer and the substrate and with the barrier insulating layer separating the charge storage layer and the conductive layer. In addition, a first hard mask layer 355 may be formed on the etch target layer 352, and the first hard mask layer 355 may include a silicon nitride layer 356 on a pad oxide layer 354.

A photoresist layer on the first hard mask layer 355 may be patterned using the photo-mask 300 to provide the photoresist pattern 358 including odd word line photoresist patterns 358w, ground select line photoresist patterns 358g, and string select line photoresist patterns 358s. More particularly, the photo-mask 300 may include a photo-mask pattern 304 on a transparent substrate 302. The photo-mask pattern 304 may include odd word line photo-mask patterns 304w corresponding to odd word line photoresist patterns 358w, ground select line photo-mask patterns 304g corresponding to ground select line photoresist patterns 358g, and string select line photo-mask patterns 304s corresponding to string select line photoresist patterns 358s.

As further shown in FIG. 7A, adjacent odd word line photo-mask patterns 304w may be spaced apart by about a width/spacing $W_{11}$, and adjacent odd word line photoresist patterns 358w may be spaced apart by about the width/spacing $W_{11}$. A first of the odd word line photo-mask patterns 304w may be spaced apart from an adjacent ground select line photo-mask pattern 304g by about a width/spacing $W_5$, and a last of the odd word line photo-mask patterns 304w may be spaced apart from an adjacent string select line photo-mask pattern 304s by about the width/spacing $W_{11}$. Similarly, a first of the odd word line photoresist patterns 358w may be spaced apart from an adjacent ground select line photoresist pattern 358g by about the width/spacing $W_5$, and a last of the odd word line photo-mask patterns 358w may be spaced apart from an adjacent string select line photo-mask pattern 358s by about the width/spacing $W_{11}$.

Moreover, each of the odd word line photo-mask patterns 304w and each of the odd word line photoresist patterns 358w may have a width of about $F_1$, and the width/spacing $W_{11}$ may be about three times the width $F_1$. In addition, adjacent ones of the odd word line photo-mask patterns 304w and adjacent ones of the odd word line photoresist patterns 358w may define a period $P_1$, and the period $P_1$ may be about 4 times the width $F_1$. The width $F_1$ may be a minimum feature size available from the photolithography technology being used. Adjacent ground select line photo-mask patterns 304g, adjacent string select line photo-mask patterns 304s, adjacent ground select line photoresist patterns 358g, and adjacent string select line photoresist patterns 358s may be separated by a width/spacing $W_2$, and the width/spacing $W_2$ may be greater than three times the width $F_1$. For example, the second spacing $W_2$ may be between about 3 and 4 times greater than the first spacing $W_1$, or the second spacing $W_2$ may be more than 3 times greater than the first spacing $W_1$, and still more particularly, more than 4 times greater than the first spacing $W_1$.

In addition, a spacing/width $W_5$ between a first odd word line photo-mask pattern 304w and an adjacent ground select line photo-mask pattern 304g and between a first odd word line photoresist pattern 358w and an adjacent ground select line photoresist pattern 358g may be greater than $W_{11}$ (e.g., greater than three times the width $F_1$). For example, the spacing/width $W_5$ may be greater than four times $F_1$.

More particularly, a continuous photoresist layer may be selectively exposed to radiation through the photomask 300 and then developed to provide the photoresist pattern 358 of FIG. 7A. Accordingly, an arrangement of the photoresist pattern 358 is defined by an arrangement of the photo-mask pattern 304. In addition, the photoresist pattern 358 corresponds to a pattern of gate select lines, string select lines, and odd word lines discussed above with respect to FIGS. 4A-B.

Portions of the first hard mask layer 355 (including silicon nitride layer 356 and pad oxide layer 354) exposed by the photoresist pattern 358 may be selectively removed (for example, using dry etching) to provide a first hard mask pattern 360 (including ground select line hard mask patterns 360g, string select line hard mask patterns 360s, and odd word line hard mask patterns 360w) as shown in FIG. 7B. If the first hard mask layer 355 includes separate layers 354 and 356, each element of the first hard mask pattern 360 may also include separate layers 354 and 356. About the spacing/width $W_5$ (greater than $W_{11}$) may be provided between a ground select line hard mask pattern 360g and a first odd word line hard mask pattern 360w. About the same spacing/width $W_{11}$ may be provided between adjacent odd word line hard mask patterns 360w, and between a last odd word line hard mask pattern 360w and a string select line hard mask pattern 360s. Each element of the first hard mask pattern 360 may include a layer of silicon nitride and/or silicon oxide. After selectively removing portions of the first hard mask layer, the photoresist pattern 358 may be removed.

As further shown in FIG. 7B, a sacrificial mask layer 362 may be formed on the first hard mask pattern 360 and on portions of the etch target layer 352 exposed by the first hard mask pattern 360, and the sacrificial mask layer 362 and the first hard mask pattern 360 may comprise different materials. For example, upper layers 356 of the first hard mask pattern 360 may be a layer of silicon nitride, and the sacrificial mask layer 362 may be a layer of polysilicon. Moreover, a thickness of the sacrificial mask layer 362 may be provided so that: gaps remain between portions of the sacrificial mask layer 362 on sidewalls of adjacent ones of the odd word line hard mask patterns 360w; gaps remain between portions of the sacrificial mask layer 362 on sidewalls of adjacent ground select line hard mask patterns 360g; gaps remain between portions of the sacrificial mask layer 362 on sidewalls of adjacent string select line hard mask patterns 360s; gaps remain between portions of the sacrificial mask layer 362 on sidewalls of adjacent select line hard mask patterns 360g and first odd word line hard mask patterns 360w; and gaps remain between portions of the sacrificial mask layer 362 on sidewalls of adjacent select line hard mask patterns 360s and last odd word line hard mask patterns 360w.

A thickness of the sacrificial mask layer 362 on sidewalls of the first hard mask patterns 360w, 360g, and 360s may be about the same as the width/spacing $W_1$ between adjacent word lines $WL_x$ and $WL_{x+1}$ shown in FIGS. 4A-B. A width of a gap remaining between portions of the sacrificial mask layer 362 on adjacent odd word line mask patterns 360W may be about the same as a width $F_1$ of an even word line $WL_2$, $WL_4$, ... $WL_{2n}$ shown in FIGS. 4A-B.

After forming the sacrificial mask layer 362, a second hard mask layer 364 may be formed on the sacrificial mask layer 362, as further shown in FIG. 7B. Moreover, the second hard mask layer 364 may be a layer of silicon oxide, and the second hard mask layer 364 may have a thickness that is at least one half of the width $F_1$ to thereby fill gaps in the sacrificial mask layer 362 between odd word line hard mask patterns 360w. Because wider gaps are provided between adjacent ground select line hard mask patterns 360g, between adjacent string select line hard mask patterns 360s, and between ground select line hard mask patterns 360g and adjacent first odd word line hard mask patterns 360w, however, gaps 368 may remain in the second hard mask layer 364. If a thickness of the second hard mask layer 364 is about the width $F_1$ of a word line, adjacent ground select line patterns 360g, adjacent string select line patterns 360s, and ground select line hard mask patterns 360g and adjacent first odd word line hard mask patterns 360w may be separated by a width/spacing greater than four times $F_1$.

Figure 7C:
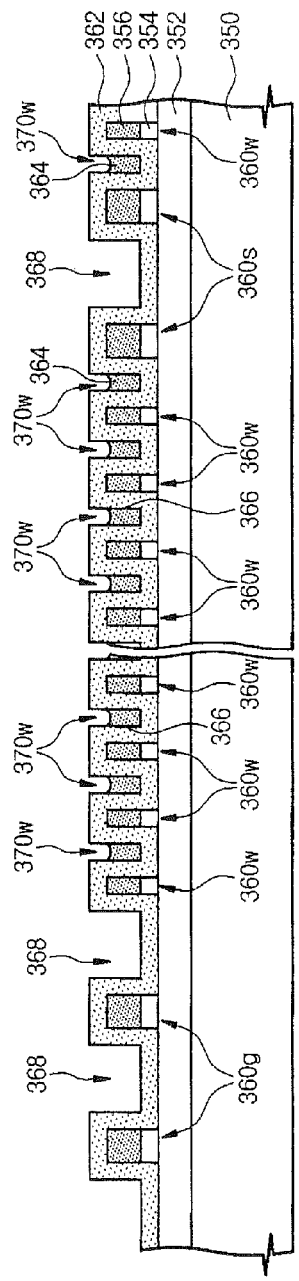

The second hard mask layer 364 may then be subjected to an etch back operation to remove portions of the hard mask layer 364 from between adjacent ground select line hard mask patterns 360g, from between adjacent string select line hard mask patterns 360s, from between ground select line hard mask patterns 360g and adjacent first odd word line hard mask patterns 360w, and from upper surfaces of the sacrificial mask layer 362, as shown in FIG. 7C. Portions of the second hard mask layer 364 remaining after the etch back operation may thus have about the thickness $F_1$. More particularly, portions of the second hard mask layer 364 remaining after the etch back operation may define a second hard mask pattern 370 on the sacrificial mask layer 362. The second hard mask pattern 370 may include even word line patterns 370w between adjacent odd word line patterns 360w and between the last odd word line patterns 360w and the adjacent string select line pattern 360s.

Exposed portions of the sacrificial mask layer 362 may then be removed (for example, using a dry etch) as shown in FIG. 7D to expose portions of the etch target layer 352 not covered by the first and/or second hard mask patterns 360 and/or 370. Exposed portions of the etch target layer 352 may then be removed (for example, using a dry etch) using the first and second hard mask patterns 360 and 370 as an etch mask, and the first and second hard mask patterns 360 and 370 may then be removed to provide the structure of FIGS. 4A-B.

According to embodiments of the present invention, NAND-type nonvolatile memory devices may be provided having structures with dimensions smaller than dimensions that may be available using one photolithographic exposure followed by one etch. Accordingly, NAND-type nonvolatile memory devices having relatively fine line and space patterns (such as patterns of word lines) may be provided, and increased integration density and/or increased performance may result.

While the present invention has been particularly shown and described with reference to embodiments thereof, it will be understood by those of ordinary skill in the art that various changes in form and details may be made therein without departing from the spirit and scope of the present invention as defined by the following claims.

That which is claimed is:

1. A method of forming a non-volatile memory device, the method comprising:

forming an etch target layer on a substrate;

forming first hard mask patterns including a plurality of odd word line patterns between first and second select line patterns, wherein about a same spacing is provided between the first select line pattern and a first odd word line pattern, between adjacent odd word line patterns, and between a last odd word line pattern and the second select line pattern, wherein the first hard mask pattern comprises a first material;

forming a sacrificial mask layer on the first hard mask pattern, wherein gaps remain between portions of the sacrificial mask layer on sidewalls of adjacent ones of the odd word line patterns, wherein the sacrificial mask layer comprises a second material, and wherein the first and second materials have different compositions;

forming second hard mask patterns on the sacrificial mask layer, wherein the second hard mask patterns includes a dummy word line pattern between the first select line pattern and the first odd word line pattern and includes even word line patterns between adjacent odd word line patterns and between the last odd word line pattern and the second select line pattern, wherein the second hard mask pattern comprises a third material, and wherein the second and third materials have different compositions;

removing portions of the sacrificial mask layer between the first and second hard mask patterns so that portions of the etch target layer are exposed between the first and second hard mask patterns; and etching portions of the etch target layer exposed between the first and second hard mask patterns.

2. A method according to claim 1 wherein the spacing provided between the first select line pattern and the first odd word line pattern is about three times a width of the first odd word line pattern.

3. A method according to claim 1 wherein the first hard mask patterns comprise silicon nitride, wherein the sacrificial mask layer comprises polysilicon, and wherein the second hard mask patterns comprise silicon oxide.

4. A method according to claim 1 wherein the odd word line patterns have about a same width and wherein the spacing between adjacent ones of the plurality of the odd word line patterns is greater than the width of the odd word line patterns.

5. A method according to claim 1 wherein forming the etch target layer comprises,
forming a charge storage layer on the substrate,
forming a barrier insulating layer on the charge storage layer, and
forming a control gate layer on the barrier insulating layer.

6. A method of forming a non-volatile memory device, the method comprising:
forming an etch target layer on a substrate;
forming first hard mask patterns on the substrate wherein the first hard mask patterns include a plurality of even word line patterns between first and second select line patterns and a dummy word line pattern between the first select line pattern and a first even word line pattern, wherein about a same first spacing is provided between the dummy word line pattern and the first even word line pattern and between adjacent even word line patterns, and wherein a second spacing is provided between the first select line pattern and the dummy word line pattern and between a last even word line pattern and the second select line pattern, wherein the second spacing is less than the first spacing, and wherein the first hard mask patterns comprise a first material;
forming a sacrificial mask layer on the first hard mask patterns wherein gaps remain between portions of the sacrificial mask layer on sidewalls of adjacent ones of the even word line patterns and between the dummy word line pattern and the first even word line pattern, wherein the sacrificial mask layer comprises a second material, and wherein the first and second materials have different compositions;
forming second hard mask patterns in the gaps on the sacrificial layer wherein the second hard mask patterns comprise odd word-line patterns between adjacent even word line patterns and between the dummy word line pattern and the first even word line pattern, wherein the second hard mask patterns comprise a third material, wherein the second and third materials have different compositions;
removing portions of the sacrificial mask layer between the first and second hard mask patterns so that portions of the etch target layer are exposed between the first and second hard mask patterns, wherein a space between the dummy word line pattern and the first select line pattern is free of any of the second hard mask patterns; and
etching portions of the etch target layer exposed between the first and second hard mask patterns.

7. A method according to claim 6 wherein the first spacing provided between the dummy word line pattern and a first even word line pattern and between adjacent even word line patterns is about three times a width of the first even word line pattern.

8. A method according to claim 7 wherein the second spacing is greater than a width of the first even word line pattern and no greater than two times the width of the first even word line pattern.

9. A method according to claim 6 wherein the second spacing is in the range of about 1.5 times the width of the first even word line pattern to about 2 times the width of the first even word line pattern.

10. A method according to claim 6 wherein the even word line patterns have about a same width and wherein the spacing between adjacent ones of the plurality of the even word line patterns is greater than the width of the even word line patterns.

11. A method according to claim 6 wherein forming the etch target layer comprises,
forming a charge storage layer on the substrate,
forming a barrier insulating layer on the charge storage layer, and
forming a control gate layer on the barrier insulating layer.

12. A method of forming a non-volatile memory device, the method comprising:
forming an etch target layer on a substrate;
forming first hard mask patterns on the substrate, wherein the first hard mask patterns include a plurality of odd word line patterns between first and second select line patterns, wherein about a same first spacing is provided between adjacent odd word line patterns and between a last odd word line pattern and the second select line pattern, and wherein a second spacing is provided between the first select line pattern and a first odd word line pattern, wherein the second spacing is greater than the first spacing, and wherein the first hard mask patterns comprise a first material;
forming a sacrificial mask layer on the first hard mask patterns, wherein gaps remain between portions of the sacrificial mask layer on sidewalls of adjacent first hard mask patterns wherein the sacrificial mask layer comprises a second material, and wherein the first and second materials have different compositions;
forming second hard mask patterns on the sacrificial layer wherein the second hard mask patterns include even word line patterns between adjacent odd word line patterns and between the last odd word line pattern and the second select line pattern, wherein a space between the first select line pattern and the first odd word line pattern is free of any of the second hard mask patterns, wherein the second hard mask patterns comprise a third material, and wherein the second and third materials have different compositions;
removing portions of the sacrificial mask layer between the first and second hard mask patterns so that portions of the etch target layer are exposed between the first and second hard mask patterns; and
etching portions of the etch target layer exposed between the first and second hard mask patterns.

13. A method according to claim 12 wherein the same first spacing is about three times a width of the first odd word line pattern.

14. A method according to claim 12 wherein fondling the etch target layer comprises,
forming a charge storage layer on the substrate,
forming a barrier insulating layer on the charge storage layer, and
forming a control gate layer on the barrier insulating layer.

* * * * *